(12) United States Patent
Holec et al.

(10) Patent No.: US 12,016,121 B2
(45) Date of Patent: Jun. 18, 2024

(54) INTERCONNECTABLE CIRCUIT BOARDS ADAPTED FOR THREE-DIMENSIONAL CONSTRUCTIONS AS LIGHTING SOURCES

(71) Applicant: Metrospec Technology, L.L.C., Mendota Heights, MN (US)

(72) Inventors: Henry V. Holec, Mendota Heights, MN (US); Brian Hillstrom, Rockford, MN (US); Wm. Todd Crandell, Minnetonka, MN (US)

(73) Assignee: Metrospec Technology, L.L.C., Mendota Heights, MN (US)

( * ) Notice: Subject to any disclaimer, the term of this patent is extended or adjusted under 35 U.S.C. 154(b) by 371 days.

(21) Appl. No.: 17/508,370

(22) Filed: Oct. 22, 2021

(65) Prior Publication Data
US 2022/0159837 A1    May 19, 2022

Related U.S. Application Data

(60) Provisional application No. 63/105,010, filed on Oct. 23, 2020.

(51) Int. Cl.
*H05K 1/11* (2006.01)
*F21V 19/00* (2006.01)
(Continued)

(52) U.S. Cl.
CPC ............ *H05K 1/117* (2013.01); *F21V 19/001* (2013.01); *H01R 12/721* (2013.01);
(Continued)

(58) Field of Classification Search
CPC ...... H05K 1/117; H05K 1/0277; H05K 1/142; H05K 2201/10106; H05K 1/148;
(Continued)

(56) References Cited

U.S. PATENT DOCUMENTS 4,227,788 A    10/1980    Shimizu et al.
5,742,484 A     4/1998    Gillette et al.
(Continued)

FOREIGN PATENT DOCUMENTS

CN    104836045    8/2015
GB     2454694    5/2009

OTHER PUBLICATIONS

"Non-Final Office Action," for U.S. Appl. No. 16/269,204 dated Dec. 19, 2019 (23 pages).
(Continued)

*Primary Examiner* — Briggitte R. Hammond
(74) *Attorney, Agent, or Firm* — Pauly, DeVries Smith & Deffner LLC

(57) ABSTRACT

Embodiments disclosed herein include to interconnectable circuit boards that can be constructed into three-dimensional shapes for use as lighting sources. An interconnectable circuit board array is included having a plurality of circuit board assemblies. The circuit board assemblies can include a first longitudinal edge, and a second longitudinal edge, and a plurality of bendable lateral board to board connectors. The plurality of bendable lateral board to board connectors are configured to provide electrical communication between a first circuit board from amongst the plurality of circuit board assemblies and a second circuit board from amongst the plurality of circuit board assemblies. Longitudinal edges of the first circuit board and of the second circuit board define a gap between the first circuit board and the second circuit board. The gap being bridged by at least one of the lateral board to board connectors. Other embodiments are also included herein.

20 Claims, 37 Drawing Sheets

(51) Int. Cl.
*F21Y 105/16* (2016.01)
*F21Y 115/10* (2016.01)
*H01R 12/72* (2011.01)
*H05K 1/02* (2006.01)
*H05K 1/14* (2006.01)

(52) U.S. Cl.
CPC ........... *H05K 1/0277* (2013.01); *H05K 1/142* (2013.01); *F21Y 2105/16* (2016.08); *F21Y 2115/10* (2016.08); *H05K 2201/10106* (2013.01)

(58) Field of Classification Search
CPC ............. H05K 1/181; H05K 2201/046; H05K 2201/047; F21V 19/001; H01R 12/721; F21Y 2105/16; F21Y 2115/10; F21Y 2107/00; F21Y 2107/30; F21K 9/00
See application file for complete search history.

(56) References Cited

U.S. PATENT DOCUMENTS

| | | | |
|---|---|---|---|
| 6,505,956 B1 | 1/2003 | Preddy et al. | |
| 7,140,751 B2 | 11/2006 | Lin | |
| 7,551,449 B2 | 6/2009 | Yasui | |
| 7,696,628 B2 | 4/2010 | Ikeuchi et al. | |
| 7,980,863 B1 | 7/2011 | Holec et al. | |
| 8,007,286 B1 | 8/2011 | Holec et al. | |
| 8,080,736 B2 | 12/2011 | DeNatale et al. | |
| 8,143,631 B2 | 3/2012 | Crandell et al. | |
| 8,593,820 B2 | 11/2013 | Suzuki et al. | |
| 8,764,237 B2 | 7/2014 | Wang et al. | |
| 8,851,356 B1 | 10/2014 | Holec et al. | |
| 9,524,811 B2 | 12/2016 | Adachi et al. | |
| 9,551,480 B2 | 1/2017 | Speer et al. | |
| 9,625,645 B2 * | 4/2017 | Matsui | G02B 6/009 |
| 9,706,646 B2 | 7/2017 | Jiang et al. | |
| 10,203,075 B1 * | 2/2019 | Kim | F21S 4/28 |
| 10,418,664 B2 | 9/2019 | Jiang et al. | |
| 10,811,799 B2 | 10/2020 | Holec et al. | |
| 10,849,200 B2 | 11/2020 | Holec et al. | |
| 2002/0094701 A1 | 7/2002 | Biegelsen et al. | |
| 2003/0071581 A1 | 4/2003 | Panagotacos et al. | |
| 2003/0091896 A1 | 5/2003 | Watanabe et al. | |
| 2004/0021792 A1 | 2/2004 | Yasui | |
| 2005/0213321 A1 | 9/2005 | Lin | |
| 2011/0096545 A1 | 4/2011 | Chang | |
| 2011/0228536 A1 | 9/2011 | Im et al. | |
| 2012/0243212 A1 | 9/2012 | Smith et al. | |
| 2013/0107514 A1 | 5/2013 | McNabb et al. | |
| 2014/0098535 A1 | 4/2014 | Smith | |
| 2014/0247595 A1 | 9/2014 | Lind et al. | |
| 2014/0265809 A1 | 9/2014 | Hussell | |
| 2014/0268779 A1 | 9/2014 | Sorensen et al. | |
| 2015/0189753 A1 | 7/2015 | Goyal et al. | |
| 2015/0354797 A1 | 12/2015 | Luo et al. | |
| 2016/0036142 A1 | 2/2016 | Mason et al. | |
| 2017/0059140 A1 | 3/2017 | Dubuc | |
| 2017/0059141 A1 | 3/2017 | Song et al. | |
| 2019/0252810 A1 | 8/2019 | Holec et al. | |
| 2020/0107412 A1 | 4/2020 | Holec et al. | |

OTHER PUBLICATIONS

"Notice of Allowance," for U.S. Appl. No. 16/269,204 dated Jun. 16, 2020 (11 pages).

"Response to Non-Final Office Action," for U.S. Appl. No. 16/269,204, filed May 19, 2020 (10 pages).

Fjelstad, Joseph "Flexible Circuit Technology, Third Edition," Br Publishing, Incorporated, 2007 (237 pages).

* cited by examiner

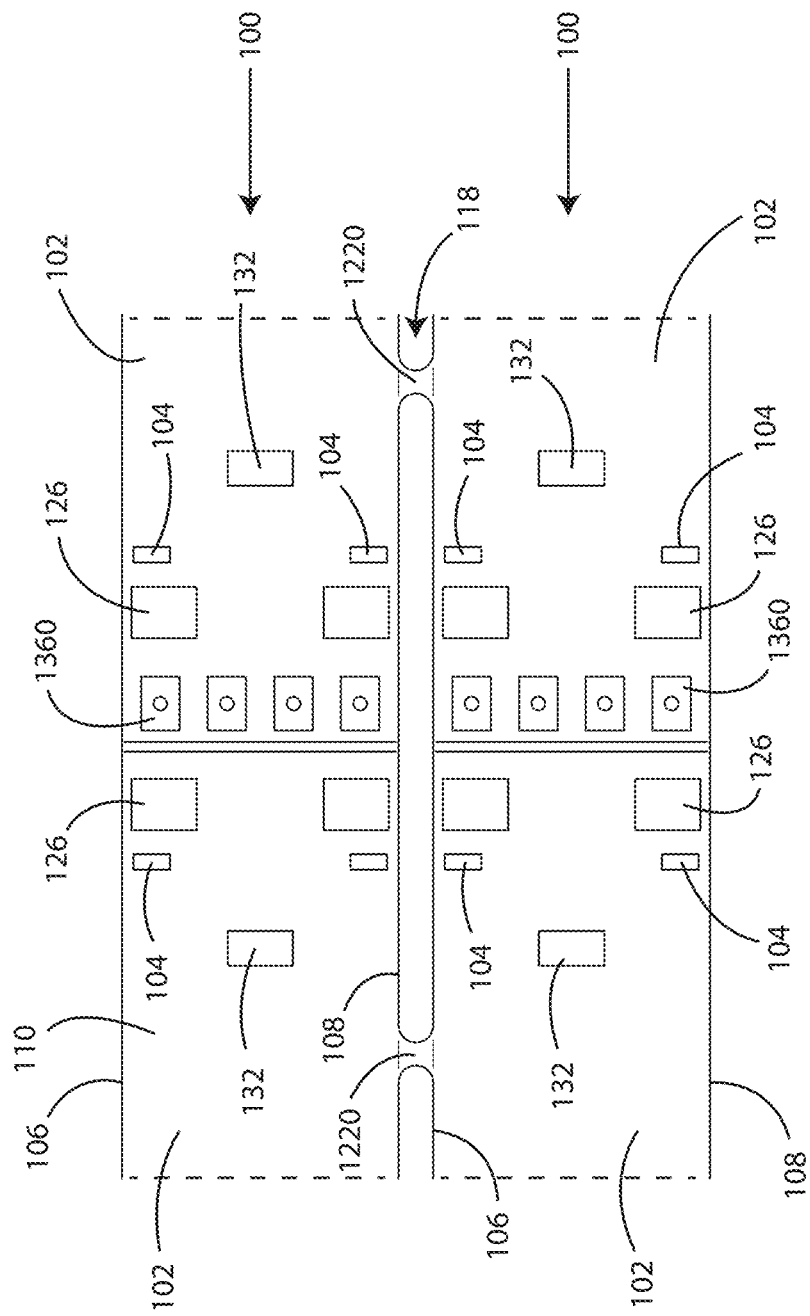

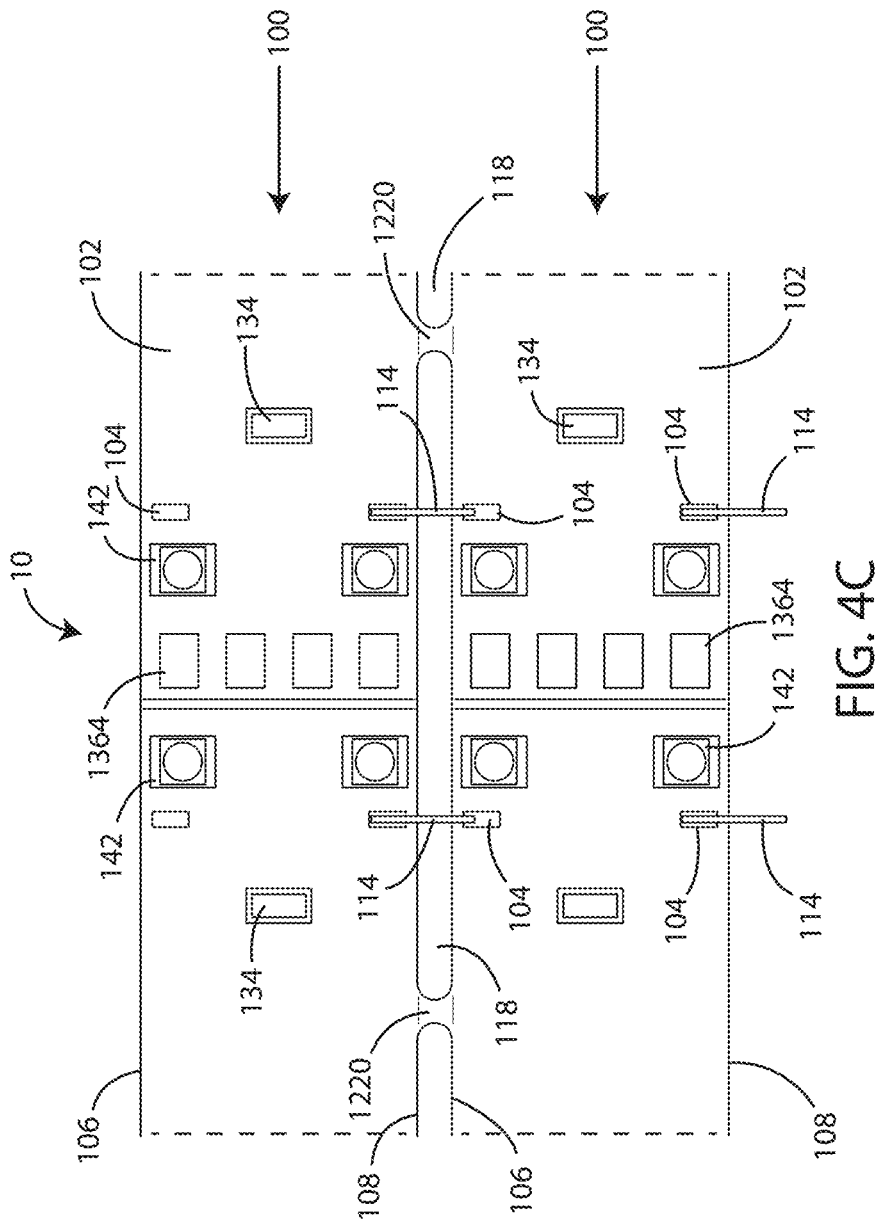

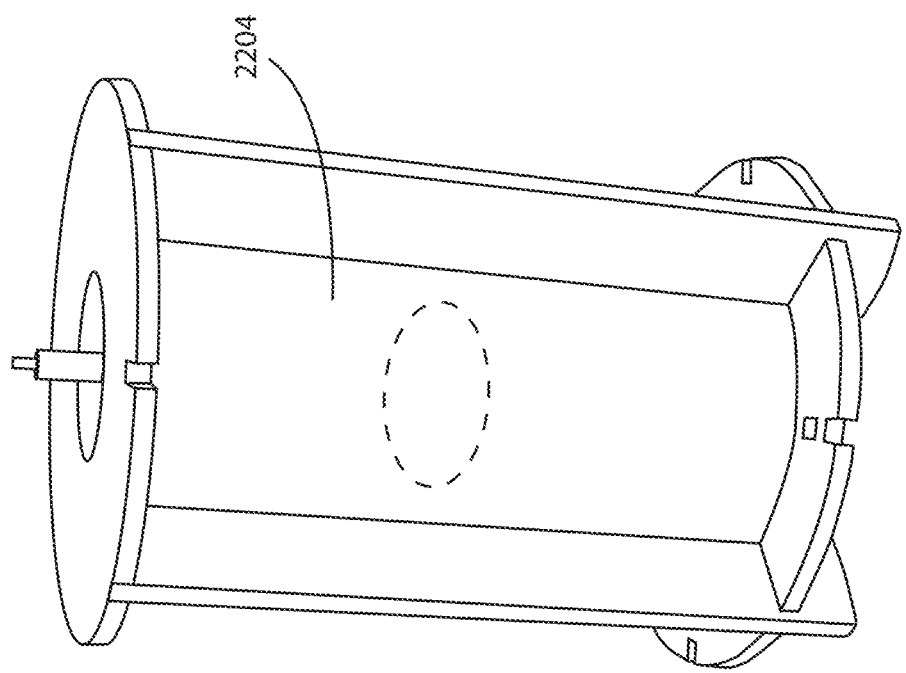
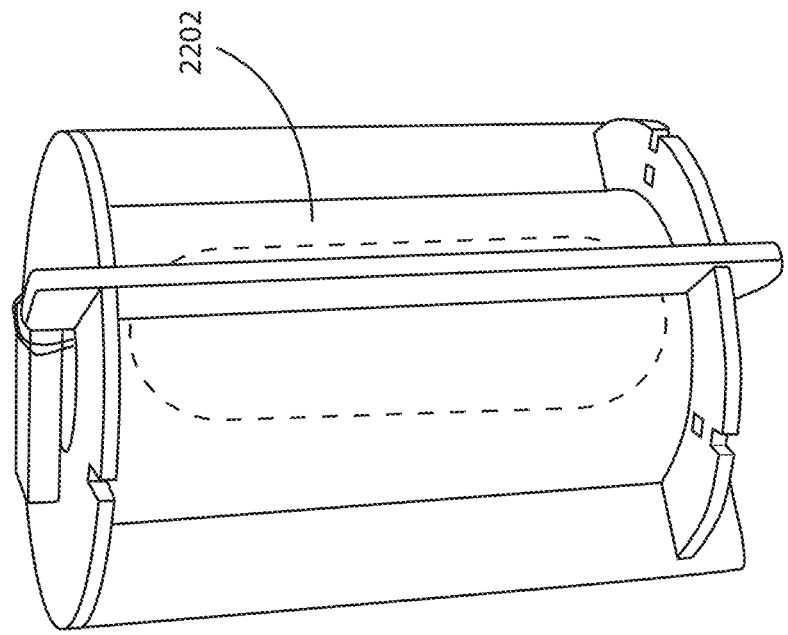
FIG. 22

INTERCONNECTABLE CIRCUIT BOARDS ADAPTED FOR THREE-DIMENSIONAL CONSTRUCTIONS AS LIGHTING SOURCES

This application claims the benefit of U.S. Provisional Application No. 63/105,010, filed Oct. 23, 2020, the content of which is herein incorporated by reference in its entirety.

FIELD OF THE TECHNOLOGY

The present application relates to interconnectable circuit boards. More specifically, the present application relates to interconnectable circuit boards that can be constructed into three-dimensional shapes for use as lighting sources.

BACKGROUND

Lighting systems utilizing multiple emitters or light emitting diodes (hereinafter "LEDs") are used in a variety of applications including but not limited to retail displays, refrigeration and freezer door systems, under cabinet lighting, track lighting, commercial ceiling lighting, and cove lighting. Continuous strings of LEDs are often used in these applications and may be individually wired together or soldered onto printed circuit board substrates. Typical applications use standard circuit board materials such as Flame Retardant 4 (FR4) or metal core printed circuit boards, which are typically rigid.

SUMMARY

Embodiments disclosed herein include an arrangement of interconnectable circuit boards that can be constructed into three-dimensional shapes for use as lighting sources. In an embodiment, a interconnectable circuit board array for lighting applications is included having a plurality of circuit board assemblies, the circuit board assemblies can include a first longitudinal edge, the first longitudinal edge can include a first electrically conductive pad, and a second electrically conductive pad, a second longitudinal edge, the second longitudinal edge can include a third electrically conductive pad, and a fourth electrically conductive pad, a plurality of board to board connectors. The board to board connectors can include a first lateral side board to board connector, wherein the first lateral side board to board connector is configured to provide electrical communication between the first electrically conductive pad of a first circuit board assembly from amongst the plurality of circuit board assemblies and the third electrically conductive pad of a second circuit board assembly from amongst the plurality of circuit board assemblies, and a second lateral side board to board connector, wherein the second lateral side board to board connector is configured to provide electrical communication between the second electrically conductive pad of the first circuit board assembly and the fourth electrically conductive pad of the second circuit board assembly. The second longitudinal edge of the first circuit board assembly and the first longitudinal edge of the second circuit board assembly define a gap between the first circuit board assembly and the second circuit board assembly, the gap being bridged by the first lateral side board to board connector and the second lateral side board to board connector. The plurality of board to board connectors are configured so that the first circuit board assembly and the second circuit board assembly can be bent in a transverse plane with respect to one another to form an angle while allowing for electrical communication between the first circuit board assembly and the second circuit board assembly.

In an embodiment, a interconnectable circuit board array for lighting applications is included having a plurality of circuit board assemblies, the circuit board assemblies can include a first longitudinal edge, and a second longitudinal edge, and a plurality of bendable lateral board to board connectors, wherein the plurality of bendable lateral board to board connectors are configured to provide electrical communication between a first circuit board from amongst the plurality of circuit board assemblies and a second circuit board from amongst the plurality of circuit board assemblies. The second longitudinal edge of the first circuit board and the first longitudinal edge of the second circuit board define a gap between the first circuit board and the second circuit board, the gap being bridged by at least one of the plurality of bendable lateral board to board connectors, and wherein the plurality of bendable lateral board to board connectors are configured so that the first circuit board and the second circuit board can be bent in a transverse plane with respect to one another to form an angle while allowing for electrical communication between the first circuit board and the second circuit board.

In an embodiment, a radial light source is included having an interconnectable circuit board array as described herein, a pair of electrical wires configured to provide power to the interconnectable circuit board array, and a mounting plate.

In an embodiment, a method of assembling a multifaceted radial lighting source is included, the method including bending at least one circuit board with respect to another circuit board in a transverse plane, and securing the bent circuit board in a bent position.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present application is defined by the appended claims and their legal equivalents.

BRIEF DESCRIPTION OF THE FIGURES

The technology may be more completely understood in connection with the following drawings, in which:

FIG. 4B is a schematic plan view of a pair of interconnectable circuit boards in accordance with various embodiments herein.

FIG. 4C is a schematic plan view of a pair of interconnectable circuit boards with electrical interconnections in accordance with various embodiments herein.

FIG. 22 is a perspective view of two cylindrical light sources in accordance with various embodiments herein.

Figure 1:
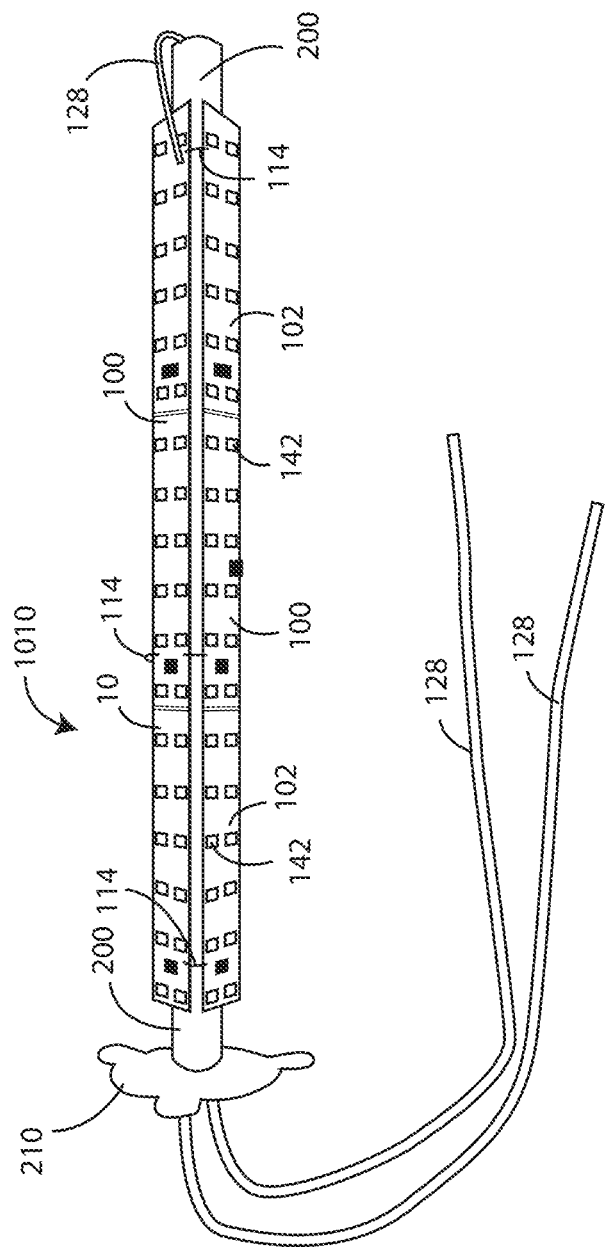
FIG. 1 is a perspective view of an interconnectable circuit board array with three sides forming a radial light source assembly in accordance with various embodiments herein.

While the technology is susceptible to various modifications and alternative forms, specifics thereof have been shown by way of example and drawings, and will be described in detail. It should be understood, however, that the application is not limited to the particular embodiments described. On the contrary, the application is to cover modifications, equivalents, and alternatives falling within the spirit and scope of the technology.

DETAILED DESCRIPTION

Lighting systems utilizing multiple emitters or light emitting diodes (hereinafter "LEDs") are used in a variety of applications including but not limited to retail displays, refrigeration and freezer door systems, under cabinet lighting, track lighting, commercial ceiling lighting, and cove lighting.

It has been found herein that in some scenarios, it can be desirable to interconnect multiple printed circuit boards carrying LEDs into a three-dimensional form to provide light in a three-dimensional illuminance pattern. In these same scenarios, there can be a need to interconnect multiple printed circuit boards carrying LEDs into a three-dimensional form of long length that is able to carry power from one circuit to another, as well as conductors for electronic communication, sensing and control.

However, the design of adequate three-dimensional light sources is technically challenging. The circuit boards themselves are generally linear or planar in form providing light output in, at most, only two directions, leaving the remainder of a 360-degree radial space without sufficient illumination. Further, it can be difficult or impossible to get circuit boards carrying LEDs to bend into a three-dimensional shape while remaining electrically connected. In some cases, simply wiring individual circuit boards together with electrical wire to form the circuit boards into a three-dimensional shape does not provide adequate mechanical structure to maintain the desired three-dimensional shape thus requiring additional mechanical supporting structure to which the circuit boards must be mounted. Heat dissipation can also present a challenge and therefore in some cases it could be thought that individual circuit boards must be affixed to elaborate heat sinks in an attempt to dissipate the higher thermal loads required for higher output, multi-sided light sources.

However, embodiments herein can fulfill a need for three-dimensional light sources including a flexible yet mechanically structurally sound connector that, when assembled in combination with a semi-rigid or rigid circuit board, allows the resulting circuit board array to be configured into various three-dimensional arrangements that remain structurally stable to the intended shape. Various embodiments of interconnectable circuit board arrays and associated methods are described herein. In various embodiments, the interconnectable circuit board array can include a plurality of interconnectable circuit boards. The circuit boards can be connected together by an electrically conductive board-to-board connector. The resulting interconnectable circuit board array can be configured such that the connected circuit boards can be angled relative to one another in a transverse plane, so as to produce a three-dimensional array of circuit boards. In some embodiments, the array can be formed into a closed triangular, rectangular, or polygonal tubular shape. In other embodiments the circuit board array can be formed into an open multi-sided triangular, rectangular, or polygonal form for connection to one or more additional circuit board arrays to produce a multi-sided final linear three-dimensional form (such as a six-sided hexagonal form, or a greater or less number of sides forming a different polygonal shape in cross-section).

The circuit boards can be angled relative to one another and mechanically attached in such a way as to remain in the intended three-dimensional shape without the necessity of other elaborate mechanical supporting structure. Additionally, the board to board electrical connections can remain intact in the final angled configuration permitting a single pair or set of electrical power connections to power the entire three-dimensional circuit board assembly. This is in contrast to a scenario where individual circuit boards are wired together with standard electrical wire and then mounted to an elaborate mechanical structure such as an extruded or formed triangular or rectangular tubular metal shape in order to maintain the intended three-dimensional shape.

In various embodiments herein, a mounting structure or support structure can be included that can take the form of a simple rod, hollow tube or threaded tube that is run lengthwise through the center of the pre-assembled circuit board assembly array. A spring clip of the circuit board assembly array along with the circuit board back surfaces can provide a compression force between the circuit board assembly array and the outer wall surface of the simple rod, hollow tube or threaded tube. The compression force can provide for sufficient force to hold the circuit board assembly array in place without the need for additional mechanical attachment. The compression force can also provide for intimate contact between the back of the circuit board and the outer surface of the hollow tube and can therefore provide for conductive heat transfer between the back side of the circuit boards and the simple rod, hollow tube, or threaded rod creating a circuit array subassembly. A wire or cable support connected directly to the circuit assembly can provide for both electrical power and a means of mechanically suspending of the circuit array subassembly. The simple rod, hollow tube or threaded tube running lengthwise through the circuit board assembly array can be either riveted, soldered, braised or otherwise mechanically or adhesively fastened to the circuit board assembly array. In some embodiments, a mechanical fastener can be used to couple the support structure to the circuit board assembly array. In some embodiments, the mechanical fastener can take the form of a plastic post that extends through an aperture in a circuit board and through the support structure, such as a barbed fastener.

In some embodiments, slots or grooves can be provided in a light fixture frame or cover to accept the corners of the circuit board assembly array or the spring wire interconnects. The full circuit board assembly array can be electrified through a wire or cable running through the inside of the full circuit array subassembly and can be either soldered, adhesively attached or left loose to suspend the assembly.

In reference to the figures, FIG. 1 a perspective view of an interconnectable circuit board array with three sides forming a radial light source assembly 1010 in accordance with various embodiments herein. The radial light source assembly 1010 can include a three-dimensional circuit board assembly array 10, a tubular subassembly 200, a mounting plate 210 and one or more wire leads 128. The three-dimensional circuit board assembly array 10 can include a plurality of circuit board assemblies 100. In various embodiments, each circuit board assembly 100 can include a plurality of circuit board portions 102. In some cases, the circuit board portions 102 can represent separable portions of a single circuit board, each with circuitry and lighting components. However, in some cases, the circuit board portions can represent discrete circuit boards that are fastened together to form an interconnected circuit board assembly that is longer than the discrete circuit boards therein by themselves as illustrated in greater detail below. The plurality of circuit board assemblies 100 can be electrically and mechanically assembled together with board to board connectors 114. The circuit board assemblies 100 can be populated with one or more LEDs 142.

Figure 2A:
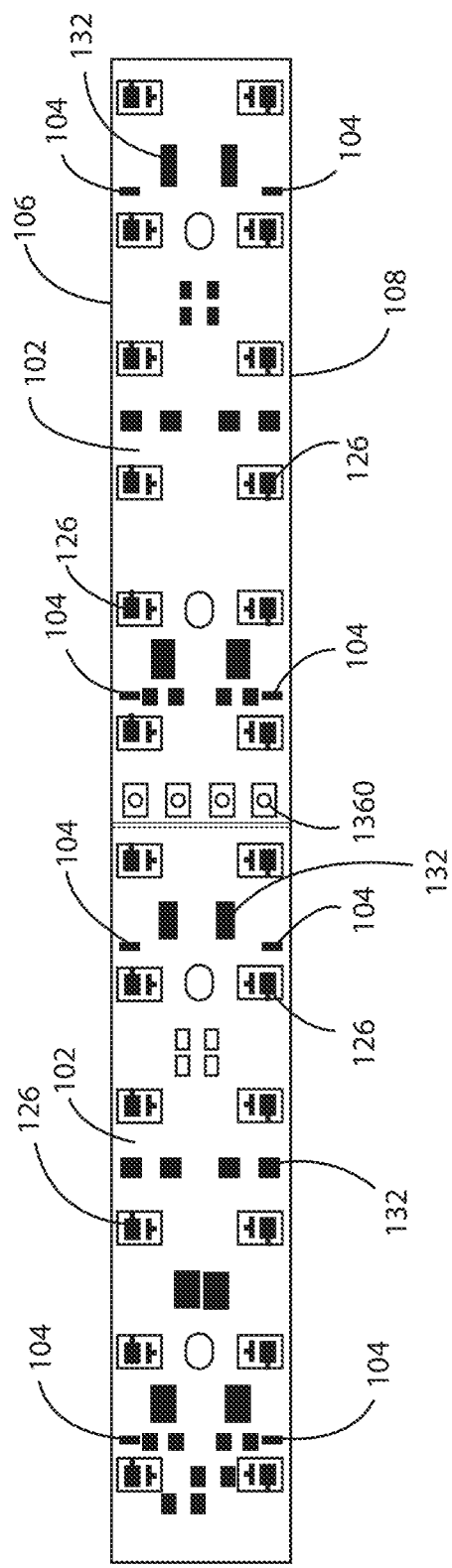
FIG. 2A is a plan view of an interconnectable circuit board in accordance with various embodiments herein.
Figure 2B:
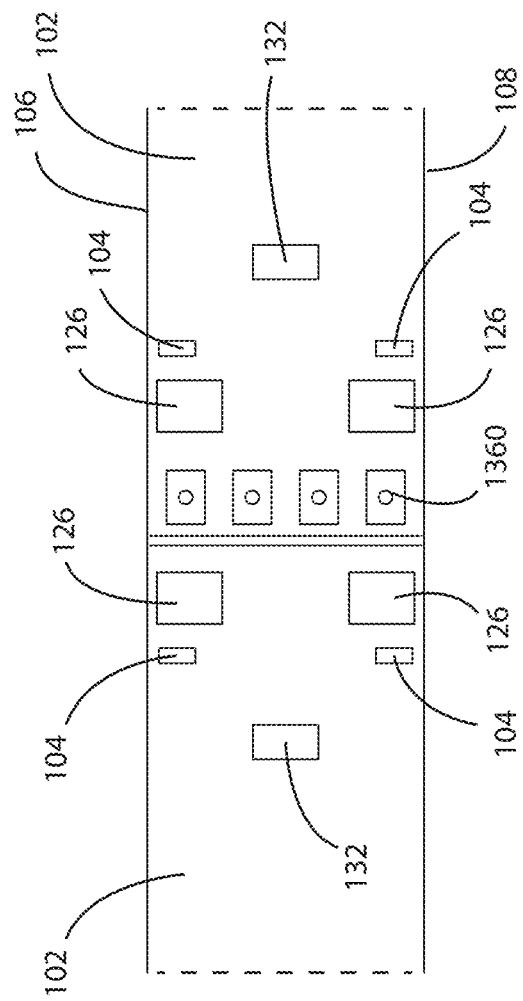
FIG. 2B is a schematic plan view of a joint between two circuit boards in accordance with various embodiments herein.

FIG. 2A shows a plan view of an interconnectable circuit board that can form a single side of a radial light source assembly in accordance with various embodiments herein. FIG. 2B shows a schematic plan view of a joint between two circuit boards, the combination of which can form a single side of a radial light source assembly in accordance with various embodiments herein. In FIGS. 2A and 2B, circuit board portions 102 with one or more conductive pads 126 to accept LEDs 142 (shown in FIG. 3A) and conductive pads 104 to accept board to board connectors 114 (shown in FIG. 3B). A set of conductive pads 104 placed along a first longitudinal edge 106 (or first lateral edge) of the circuit board portions 102 and a second set of conductive pads 104 placed along a second longitudinal edge 108 (or second lateral edge) of the circuit board portions 102. The circuit board portions 102 can also include conductive pads 132 to accept other electrical components 134 such as resistors, capacitors, TVS or semiconductors to complete the electrical circuit.

In some embodiments, such as where the circuit board portions 102 represent separate circuit boards that are fastened together, a plurality of through-holes 1360 (such as plated through-holes) can be disposed in at least one of the two circuit board portions. The plated through-holes 1360 can be used as receptacles for solder paste so the individual boards can be ready for joining by heat alone. The circuit board portion 102 with the plurality of plated through-holes 1360 can be disposed on top of the other circuit board portion 102 to provide for joining of the first circuit board portion 102 to the second circuit board portion 102.

Figure 3A:
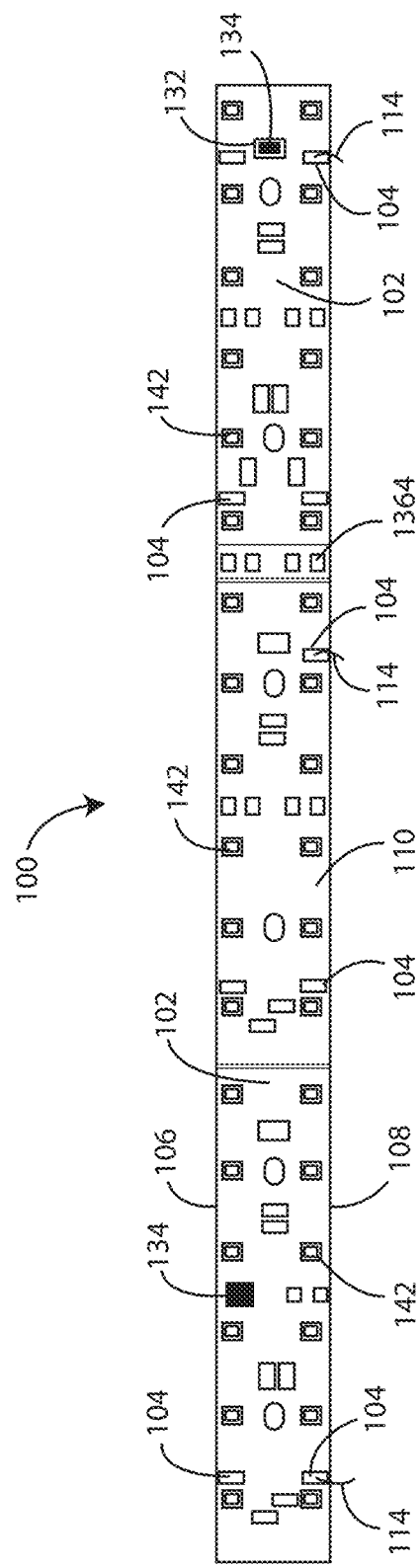
FIG. 3A is a plan view of a plurality of circuit boards with electrical components assembled together in accordance with various embodiments herein.
Figure 3B:
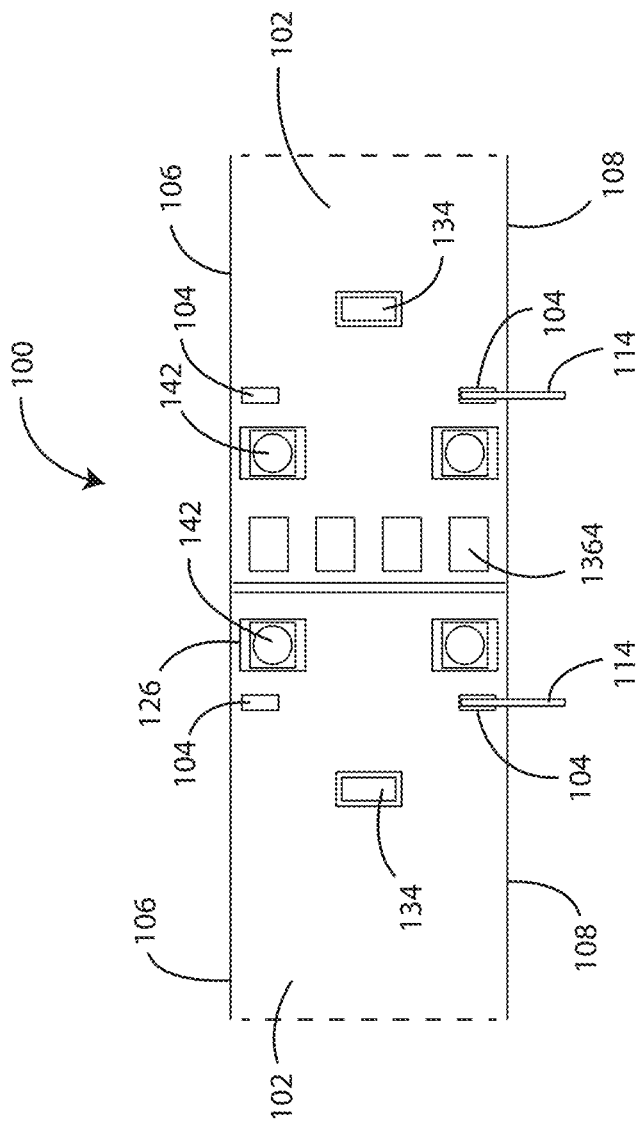
FIG. 3B is a schematic plan view of a plurality of circuit boards with electrical components assembled together in accordance with various embodiments herein.

In FIGS. 3A and 3B, the plurality of circuit board portions 102 are assembled into a circuit board assembly 100. The circuit board portions 102 (and therefore the circuit board assembly 100) include one or more conductive pads 126 and are populated with one or more LEDs 142. The circuit board portions 102 and circuit board assembly 100 can include one or more board to board connectors 114 attached to electrically conductive pads. The circuit board portions 102 can also include one or more electrical components 134 such as resistors, capacitors, TVS or semiconductors to complete the electrical circuit board assembly 100.

In some embodiments, some of the circuit board portions 102 can specifically be connected with each other in an at least partially overlapping arrangement 1364, such as described in U.S. patent application Ser No. 12/372,499 filed on Feb. 17, 2009, issued as U.S. Pat. No. 7,980,863, which is herein incorporated by reference in its entirety, and also described in U.S. patent application Ser. No. 12/406,761 filed on Mar. 18, 2009, issued as U.S. Pat. No. 8,007,286, which is herein incorporated by reference in its entirety. However, in some embodiments, some of the circuit board portions 102 can specifically be connected with each other via a butt joint arrangement or via another attachment configuration. In other embodiments, some of the circuit board portions 102 in the longitudinal direction can be connected via board to board connectors 114, such as described in U.S. patent application Ser. No. 16/269,204 filed on Feb. 6, 2019, issued as U.S. Pat. No. 10,811,799, which is herein incorporated by reference in its entirety.

Figure 25:
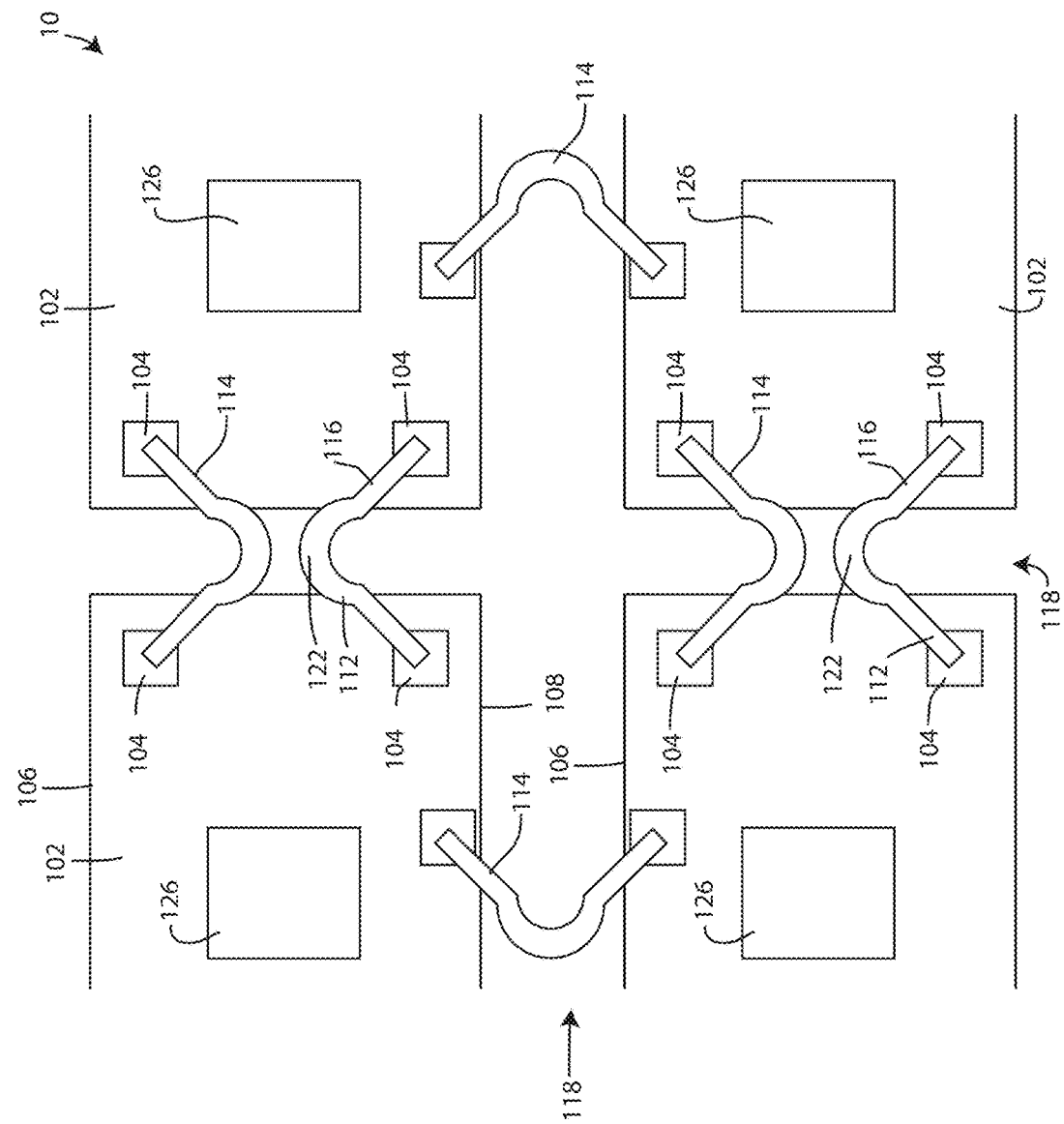
FIG. 25 is a schematic plan view of a plurality of circuit boards assembled in accordance with various embodiments herein.

As shown in FIG. 25, in some embodiments, an array 10 of circuit board portions 102 can be created by connecting adjacent circuit board portions, in both the longitudinal direction and the lateral direction, with board to board connectors 114. In some embodiments, the lateral board to board connectors 114 can be the same as the longitudinal board to board connectors 114. The array can include gaps 118 that extend in the lateral direction and in the longitudinal direction. The board to board connectors 114 can span across the gaps 118 to provide electrical and mechanical connections between adjacent circuit board portions 102.

Figure 23:
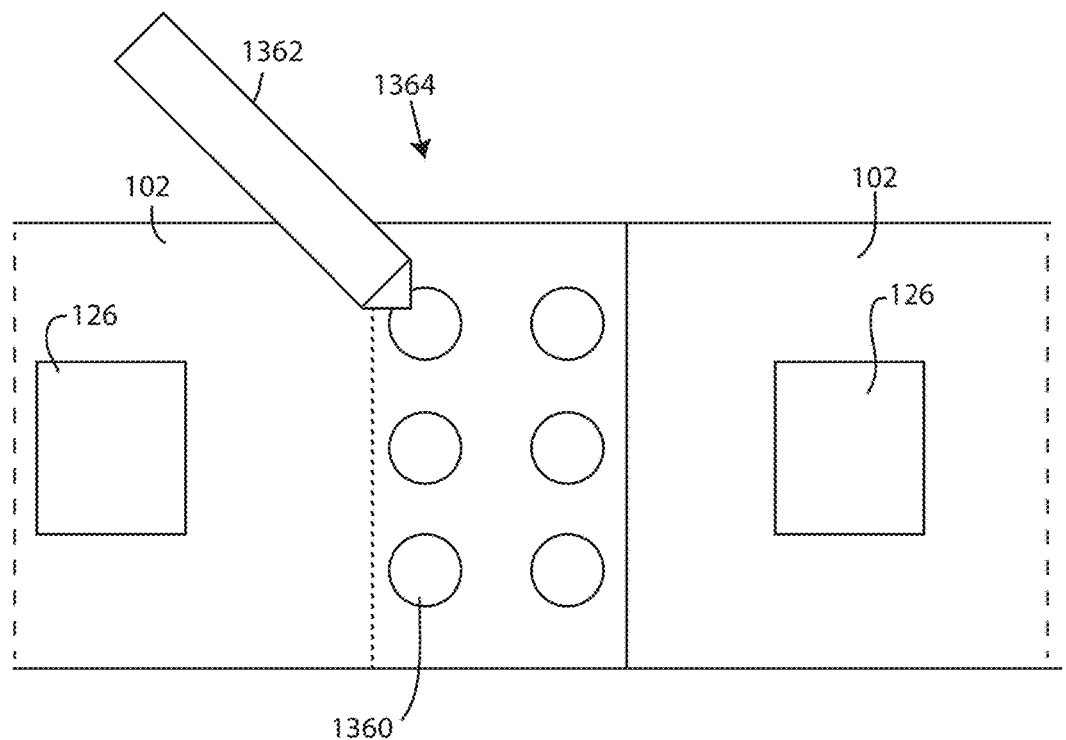
FIG. 23 is a schematic plan view of two circuit board portions being connected together in accordance with various embodiments herein.
Figure 24:
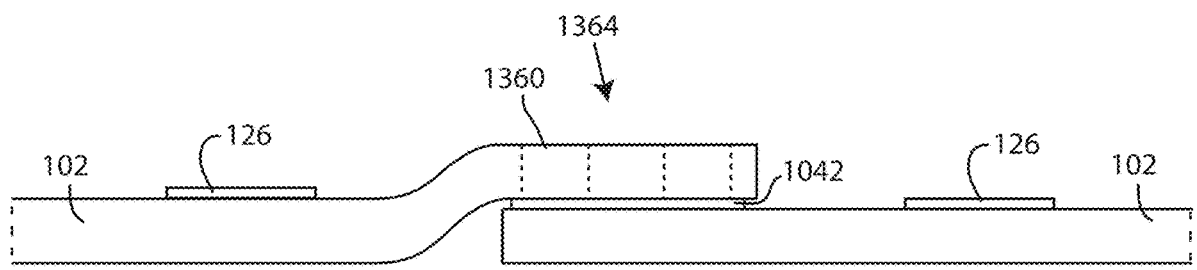
FIG. 24 is a schematic side view of the two circuit board portions from FIG. 23 being connected together in accordance with various embodiments herein.

Jumping to FIGS. 23 and 24, two circuit board portions 102 are shown connected in an overlapping arrangement 1364. FIG. 23 shows two circuit board portions (as discrete circuit boards) being connected in an overlapping arrangement 1364. FIG. 24 shows a side view of the two circuit board portions 102 connected in an overlapping arrangement 1364. A plurality of plated through-holes 1360 can be disposed in one of the two circuit board portions 102. The plated through-holes 1360 can be used as receptacles for solder paste so the boards can be ready for joining by heat alone. The circuit board portion 102 with the plurality of plated through-holes 1360 can be disposed on top of the other circuit board portion 102. Once the circuit board portions 102 are aligned they can be heated, for example using a soldering iron 1362, in the area of the overlapping arrangement 1364 to cause the solder to begin melting. By capillary action and wetting, the solder can quickly flow into the space between the boards and conductive pads 1042 completing the connection between the two circuit board portions 102. FIGS. 23 and 24 show a series of six plated through-holes 1360, though it will be appreciated that other numbers are contemplated herein.

In various embodiments, the two circuit board portions 102 can be provided in an overlapping arrangement without through-holes. Solder can be applied to the top surface of the top circuit board portion 102 contacting a conductive pad on the top surface of the top board. The solder can extend over the edge of the top board and onto the top surface of the bottom circuit board portion 102 contacting a conductive pad on the top surface of the bottom board.

In some embodiments, a lateral end of the board to board connectors 114 can be attached to the electrically conductive pads 104 along one longitudinal edge 108 of circuit board portion 102. The circuit board assembly 100 can be held in this configuration and then, at some later time, be connected to additional circuit board assemblies 100 of a similar configuration by attachment of the lateral side conductor 116 of board to board connectors 114 to a set of electrically conductive pads 104 on the longitudinal edge 106 to the second circuit board assembly 100.

Figure 4A:
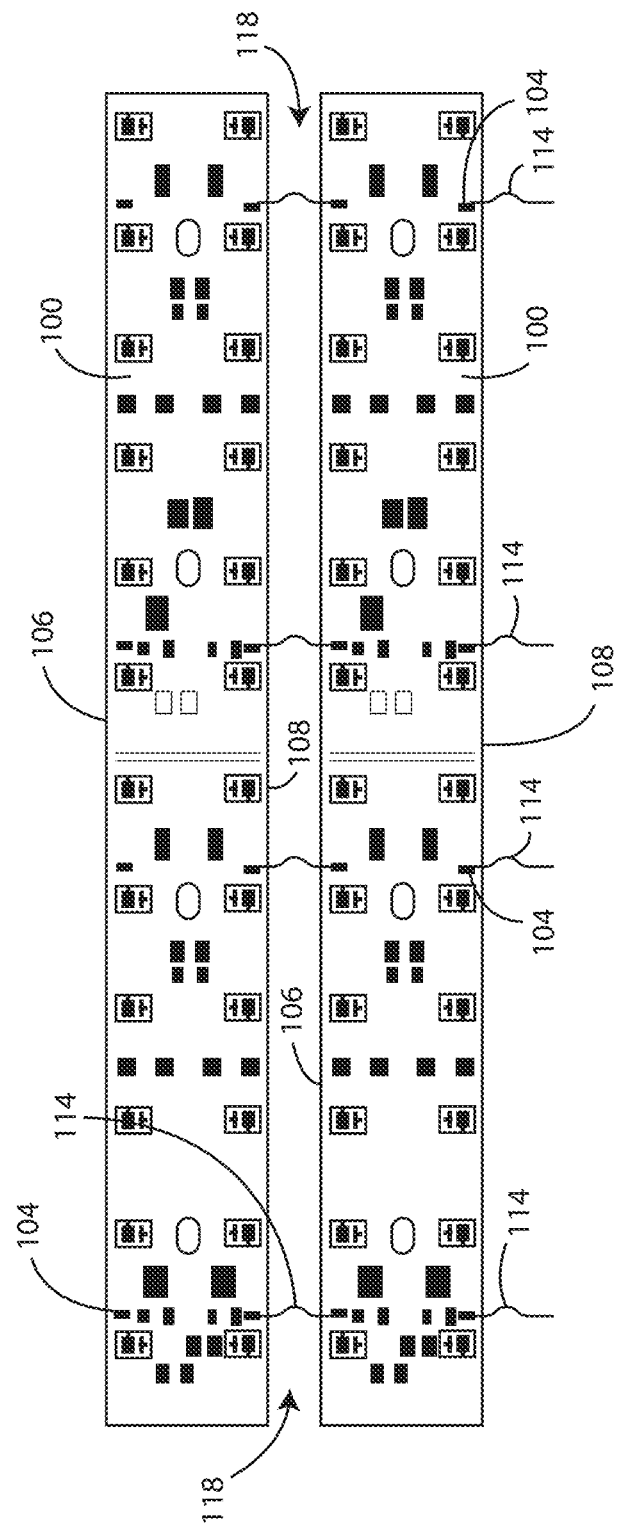
FIG. 4A is a plan view of a pair of interconnectable circuit boards forming at least part of an interconnectable circuit board array in accordance with various embodiments herein.

FIG. 4A shows a plan view of a pair of interconnectable circuit board assemblies 100 forming at least part of an interconnectable circuit board array that can be used to form a radial light source assembly in accordance with various embodiments herein. FIG. 4A specifically shows conductive pads 104, first longitudinal edges 106, second longitudinal edges 108, board to board connectors 114, and a gap 118 separating the pair of interconnectable circuit board assemblies 100. In this example, the pair of interconnectable circuit board assemblies 100 are electrically and mechanically interconnected via the board to board connectors 114.

FIG. 4B is a schematic plan view of a pair of interconnectable circuit boards that can be used to form a radial light source assembly in accordance with various embodiments herein. In some embodiments, such as in FIG. 4B, a first circuit board portion 102 (from a first interconnectable circuit board assembly 100) can be positioned alongside a second circuit board portion 102 (from a second interconnectable circuit board assembly 100) for the purpose of later electrically and mechanically joining the first circuit board portion 102 to the second circuit board portion 102 with a single or a plurality of board to board connectors 114 (shown in FIG. 4C). A circuit board portion 102 can include a first conductive pad 104 and a second conductive pad 104 on a first longitudinal edge 106 of the circuit board portion 102 from the first interconnectable circuit board assembly 100, and a third conductive pad 104 and a fourth conductive pad 104 on a second longitudinal edge 108 of the circuit board portion 102 of the second interconnectable circuit board assembly 100. The electrically conductive pads 104 can be located on a top surface 110 of the circuit board portion 102. In various embodiments, a first circuit board portion 102 of a first interconnectable circuit board assembly 100 can be spaced from a second circuit board portion 102 of a second interconnectable circuit board assembly 100 by a gap 118. The gap 118 can be established by a plurality of tabs 1220. The plurality of tabs 1220 can establish a uniform gap 118 between the longitudinal edge 106 of one interconnectable circuit board to the longitudinal edge 108 of a second interconnectable circuit board. In some embodiments, there is not a gap 118 between adjacent boards. In other embodiments, the adjacent boards with aligning longitudinal axis can be temporarily joined, such as with edge 108 of the first board and edge 106 of the second board. In some embodiments the boards can be temporarily joined, such that a user can separate them along a scored portion that defines the longitudinal edge 108 of the first board and the longitudinal edge 106 of the second board. The scored portion can be broken or fractured to allow the adjacent boards to be separated while still being electrically and mechanically linked with at least one board to board connector 114.

FIG. 4C is a schematic plan view of a pair of interconnectable circuit board assemblies with electrical interconnections that can be used to form a radial light source assembly in accordance with various embodiments herein. In FIG. 4C, the interconnectable circuit board assemblies 100 included in the circuit board assembly array are connected together with a board to board connectors 114. The interconnectable circuit board assemblies 100 are populated with one or more LEDs 142. The interconnectable circuit board assemblies 100 can be populated with electrical components 134. A board to board connector 114 placed over the gap 118 electrically connects one or more conductive pads 104 on a first interconnectable circuit board assembly 100 to one or more conductive pads 104 on a second interconnectable circuit board assembly 100.

In some embodiments, one lateral side conductor of board to board connector 114 can be connected to pads 104 on the second longitudinal edge 108 of the first interconnectable circuit board assembly 100 leaving the other lateral side conductor of the board to board connector 114 free from attachment for future connection to a third interconnectable circuit board assembly 100.

In some embodiments, the conductive pads 104 are constructed along the longitudinal edges 106 and 108 on the interconnectable circuit board assemblies 100 as to allow the removal of the alignment tab 1220 by a tool with the board to board connector 114 in place and without interference from the board to board connector 114 or the board to board connector lateral ends.

Figure 17:
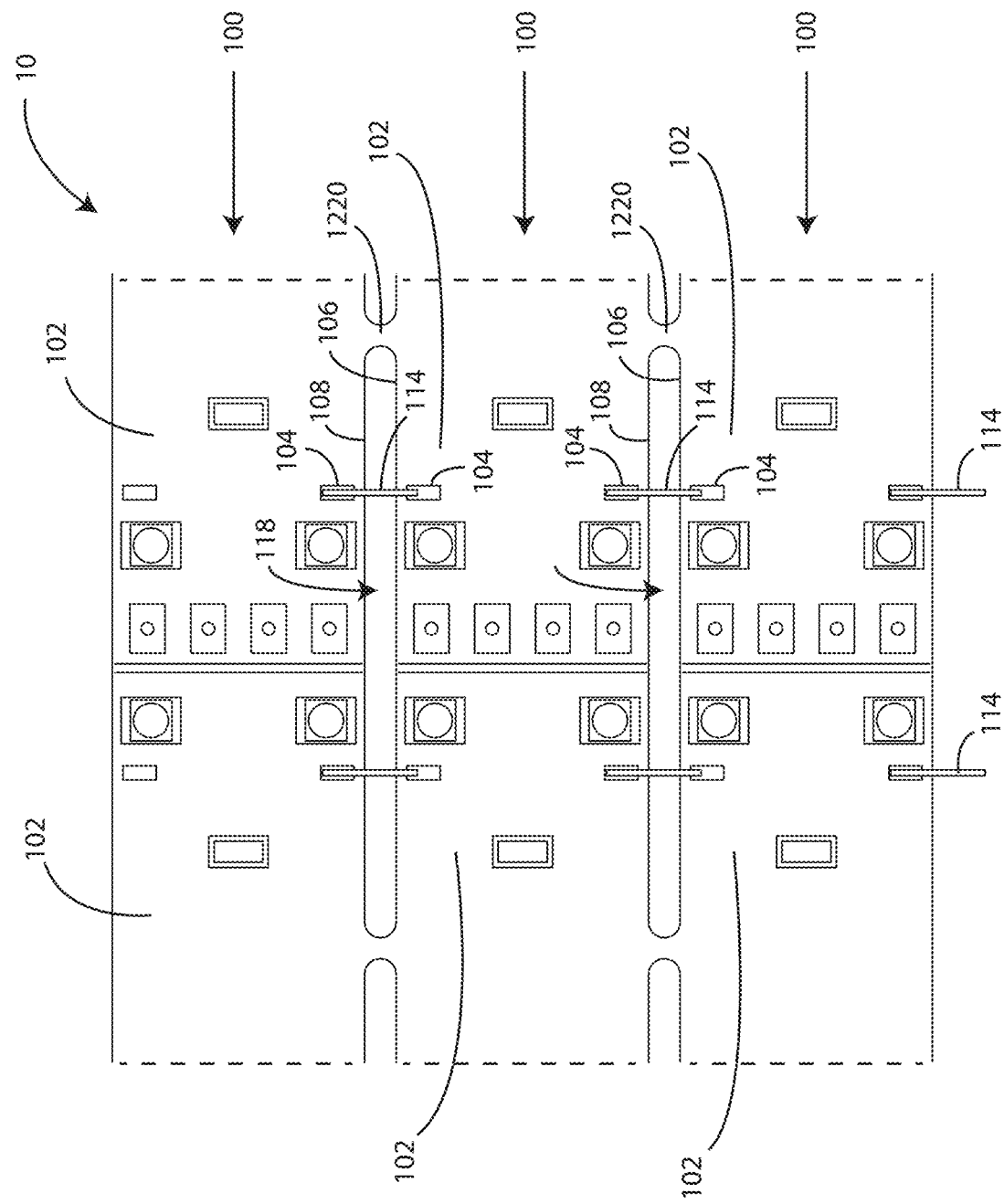
FIG. 17 is a schematic plan view of an interconnectable circuit board array with three circuit board assemblies in accordance with embodiments herein.

Jumping to FIG. 17, a schematic plan view of an interconnectable circuit board array with three circuit board assemblies in accordance with embodiments herein. In the embodiment of FIG. 17, three circuit board assemblies 100, each with a plurality of circuit board portions 102, are placed adj acent to each other with one longitudinal edge (106 or 108) parallel to the adjacent circuit board assembly longitudinal edge (106 or 108). A first circuit board assembly 100 with a longitudinal edge 108 positioned parallel to the longitudinal edge 106 of a second circuit board assembly 100. The second circuit board assembly 100 can have a longitudinal edge 108 positioned parallel to the longitudinal edge 106 of a third circuit board assembly 100. Each circuit board assembly 100 positioned laterally and parallel to the adjacent circuit board assembly 100 and separated by the gap 118 as established by the length of tab 1220. The first circuit board assembly 100 can have conductive pads 104 along the longitudinal edge 108 and the second circuit board assembly 100 can have conductive pads 104 along the longitudinal edge 106. Board to board connectors 114 are included with one lateral end connected to the conductive pads 104 on the first circuit board assembly 100 and the board to board connectors 114 with a second lateral end connected to the conductive pads 104 on the second circuit board assembly 100. The second circuit board assembly 100 can have conductive pads 104 along the longitudinal edge 108 and the third circuit board assembly 100 can have conductive pads 104 along the longitudinal edge 106. Board to board connectors 114 can be present with one lateral end connected to the conductive pads 104 on the first circuit board assembly and the board to board connectors 114 with a lateral end connected to the conductive pads 104 on the third circuit board assembly 100. The third circuit board assembly 100 has conductive pads 104 along the longitudinal edge 106. Board to board connectors 114 can be present with one lateral end connected to the conductive pads 104 on the third circuit board assembly 100 along the longitudinal edge 106. The board to board connectors 114 can be left with one lateral end left unconnected. The three connected circuit board assemblies 100 can form a circuit board assembly array 10.

In some embodiments, one or more clips or spring clips can be used to hold an array in a bent position. For example, with reference to FIG. 17, in some embodiments, board to board connectors 114 on the lateral end (e.g., those shown at the bottom of FIG. 17) can be replaced or supplemented by spring clips. In the example of FIG. 17, if the three connected circuit board assemblies 100 are bent into the form of a triangle, the spring clips can then be used to hold together the last two circuit board assemblies 100 to meet as the triangular shape takes form (in this case the top most circuit board assembly 100 shown in FIG. 17 and the bottom most circuit board assembly 100 shown in FIG. 17). However, in other embodiments, spring clips can be omitted and another technique of holding the array in a bent position can be used or the array may stay in the bent position without the use of any particular technique to hold it in a bent position.

The board to board connectors 114 can be configured such that the connectors 114 can maintain their shape after they are deformed. The connectors 114 can be configured to be sufficiently strong enough to support the circuit board assemblies 100. Arranging the circuit board assemblies 100 into their desired configuration can include bending one or more connector 114. The connector 114 can maintain it shape and the boards can maintain their position once they are in the desired configuration and the bending/moving force has been terminated. In various embodiments, an array 10 of circuit board assemblies 100 can be self-supporting, such that it can maintain its desired configuration without additional support.

Figure 18:
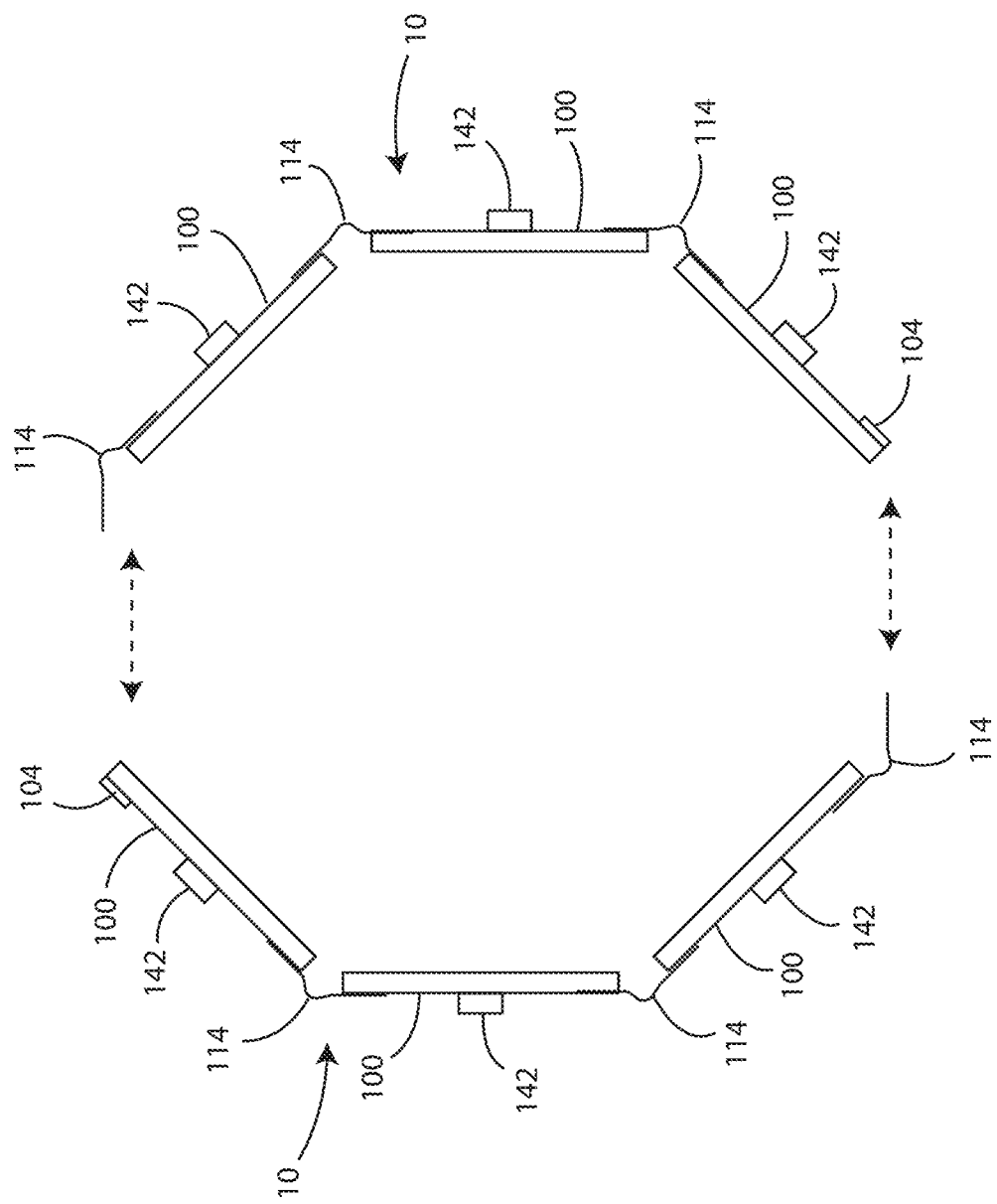
FIG. 18 is a schematic end view of a pair of interconnectable circuit board arrays, each including three circuit board assemblies, formed into half-hexagonal shapes and prepared for final connection in accordance with various embodiments herein.

Referring now to FIG. 18, a schematic end view is shown of a pair of interconnectable circuit board assemblies 100, each including three circuit board assemblies 100, formed into half-hexagonal shapes and prepared for final connection.

In FIG. 18, a first circuit board assembly array 10 consisting of three circuit board assemblies 100 is formed into one half of a hexagonal three-dimensional linear shape. A second circuit board assembly array 10 consisting of three circuit board assemblies 100 is formed into a second half of a hexagonal three-dimensional linear shape. The first circuit board assembly array 10 with a plurality of board to board connectors 114 attached on one lateral end and with one lateral end free. The second circuit board assembly array 10 includes a plurality of conductive pads 104 free of connections. The second circuit board assembly array 10 includes a plurality of board to board connectors 114 attached on one lateral end and with one lateral end free. The first board assembly array 10 includes a plurality of conductive pads 104 free of connections. The circuit board arrays' free lateral end of the board to board connectors 114 and the open conductive pads 104 are in alignment. The first circuit board assembly 100 can be connected mechanically and electrically to the second circuit board assembly 100 via the free lateral ends of the board to board connectors 114 and conductive pads 104 along both unconnected longitudinal edges to form a hexagonally shaped tubular light source with a plurality of LEDs 142 on the exterior surface of the hexagonally shaped tubular light source.

Figure 19:
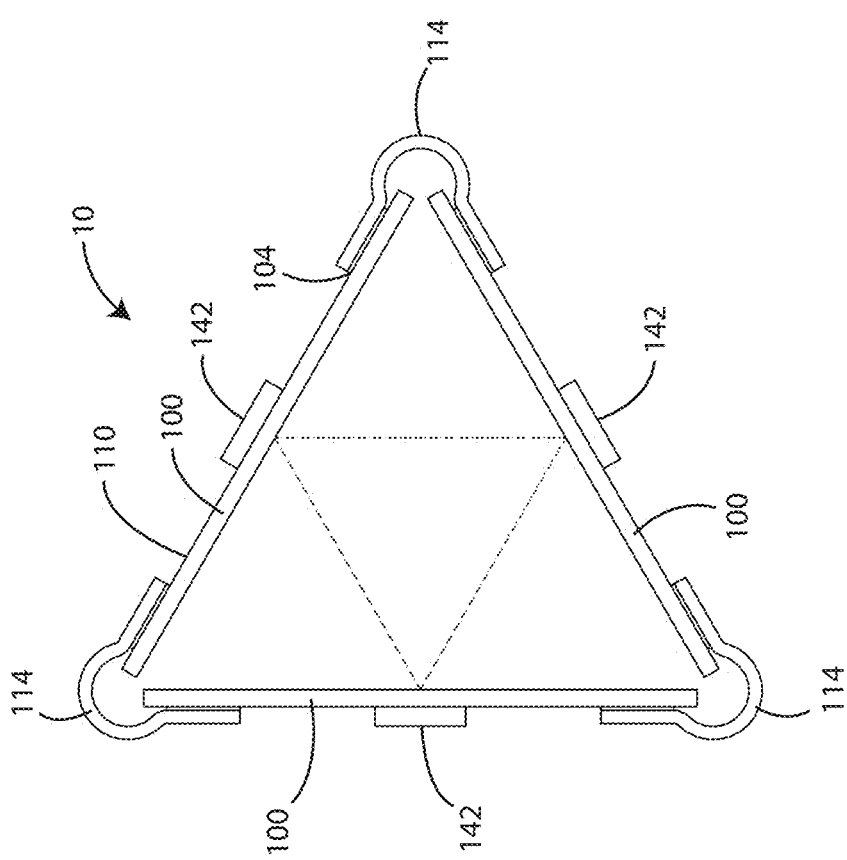
FIG. 19 is a schematic end view of an interconnectable circuit board array with three sides forming a triangular radial light source assembly in accordance with various embodiments herein.

Referring now to FIG. 19, a schematic end view is shown of an interconnectable circuit board array with three sides forming a triangular radial light source assembly in accordance with various embodiments herein.

In FIG. 19, the three-circuit board assembly array 10 is formed into a three-sided closed triangle. The circuit board assembly array 10, referring to FIG. 17, includes three circuit board assemblies 100 with one longitudinal edge 108 with a plurality of board to board connectors 114 attached on one lateral end and with one lateral end free from connection. The circuit board assembly array 10 includes a second longitudinal edge 106 with conductive pads 104 free of connections. The plurality of lateral ends of the board to board connectors 114 are aligned with the plurality of conductive pads 104. The circuit board assembly array 10 is mechanically and electrically connected via the plurality of lateral ends of the board to board connectors 114 connected to the plurality of conductive pads 104 forming a closed three-dimensional tubular lighting circuit with a plurality of LEDs 142 on the top or exterior surface 110.

Figure 5A:
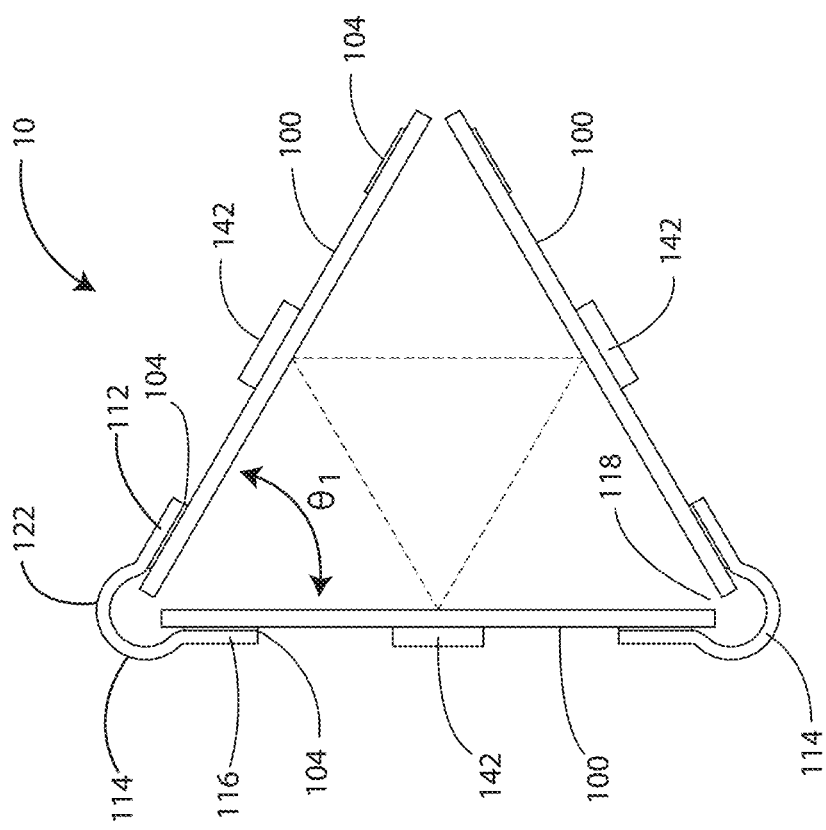
FIG. 5A is a schematic end view of an interconnectable circuit board array with three sides forming a triangular radial light source assembly in accordance with various embodiments herein.

Referring now to FIG. 5A a schematic end view of an interconnectable circuit board array with three sides forming a triangular radial light source assembly is shown in accordance with various embodiments herein. In various embodiments, such as that shown in FIG. 5A, a board to board connector 114 can include a first lateral side conductor 112 and a second lateral side conductor 116. The first lateral side conductor 112 and the second lateral side conductor 116 can be electrically conductive. The first lateral side conductor 112 can be linked or connected by a curved portion 122. The first lateral side conductor 112 can provide electrical communication between a conductive pad 104 on a first circuit board assembly 100 and a conductive pad 104 on a second circuit board assembly 100 within the circuit board assembly array 10. The second lateral side conductor 116 can provide electrical communication between a second conductive pad 104 on the first circuit board assembly 100 and a second conductive pad 104 on the second circuit board assembly 100. The board to board connector 114, lateral side conductors 112, 116 and curved portion 122, can include an electrically conductive material, such as copper, aluminum, gold, silver, alloys including one or more of these, or the like.

Figure 5B:
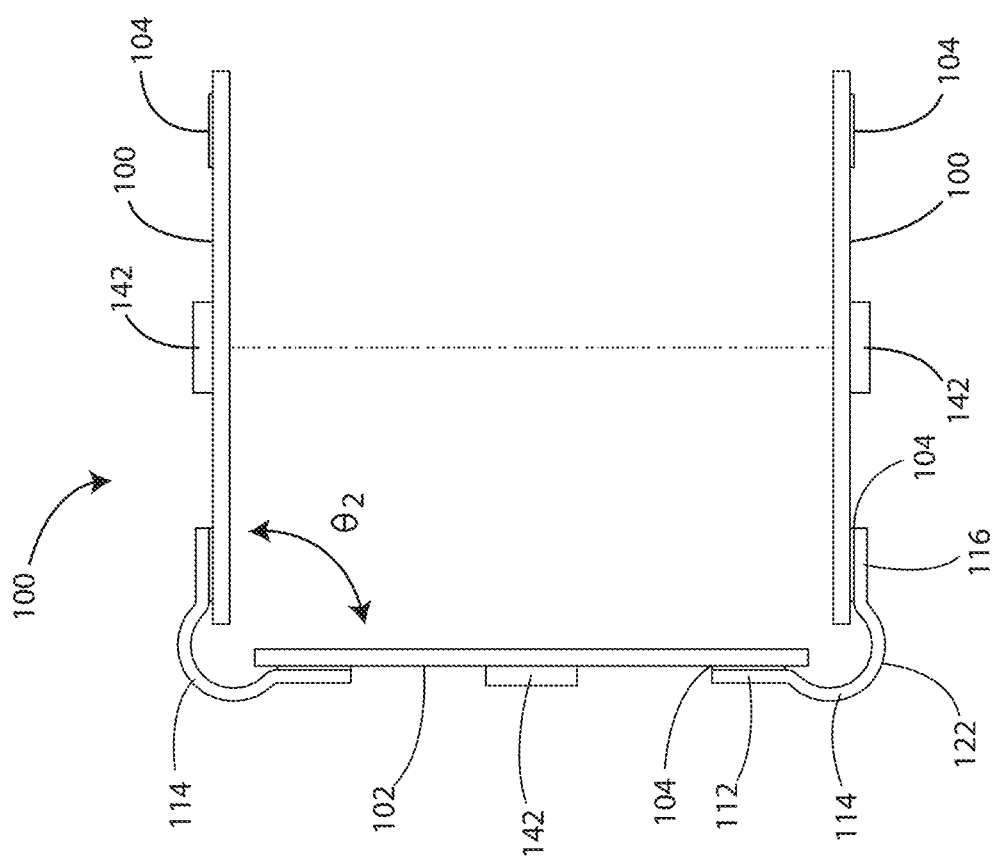
FIG. 5B is a schematic end view of an interconnectable circuit board array with three sides forming a partial rectangular radial light source assembly in accordance with various embodiments herein.

In the embodiment of FIG. 5A, the first lateral side conductor 112 of the board to board connector 114 can be located in the same lateral plane as the second lateral side conductor 116. The first lateral side conductor 112 and the second lateral side conductor can be mirrored copies of each other. In many embodiments, the lateral side conductors 112, 116 can include at least one axis of symmetry. In some embodiments, the board to board connector 114 can be formed such to create a spring force between lateral side conductor 112 and lateral side conductor 116 when moved laterally to one another. A gap 118, as shown in FIG. 4A, can be defined between two adjacent circuit board assemblies 100. The gap 118 can be open space between the longitudinal edge 108 of one circuit board assembly 100 and the longitudinal edge 106 of the adjacent circuit board assembly 100. The board to board connectors 114 can each bridge the gap 118. The gap 118 can allow the board to board connector 114 to be bent such that the circuit board assemblies 100 can be repositioned with respect to one another in a transverse plane to form an angle $\theta_1$. In the repositioned configuration, the gap 118 can be reduced in size allowing the two circuit board assemblies 100 to be positioned at an angle $\theta_1$ to one another and placing circuit board assemblies 100 closer in proximity to one another. In some embodiments, one or more circuit board assemblies 100 can be repositioned to the same angle $\theta_1$ to form an open triangle as shown in FIG. 5A. However, in other embodiments, such as that shown in FIG. 5B, one or more circuit board assemblies 100 can be repositioned to a different angle $\theta_2$ to form an open rectangle.

Figure 8:
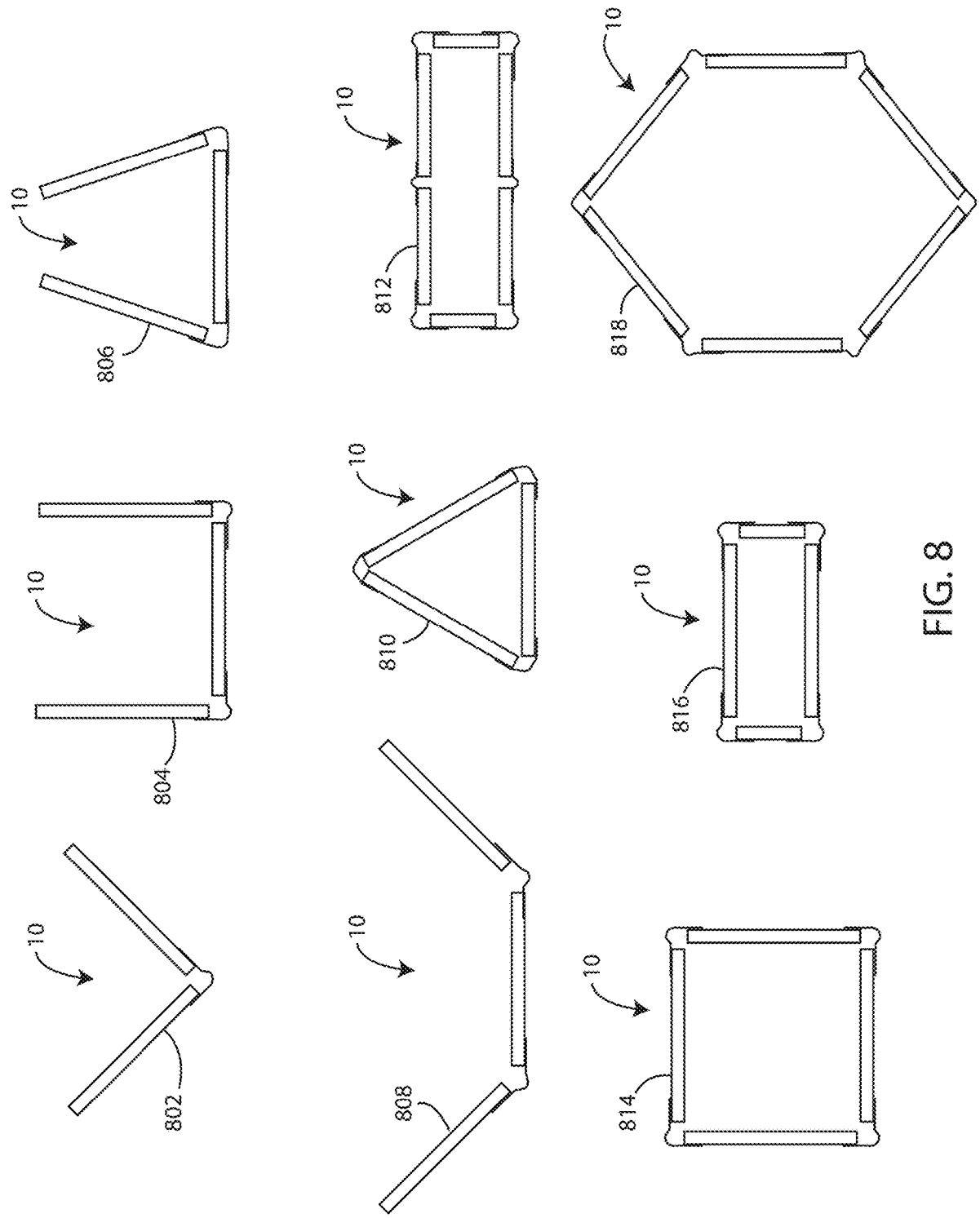
FIG. 8 is a schematic view of cross-sections of various opened and closed geometrical embodiments of radial light source assemblies in accordance with various embodiments herein.

In yet further embodiments, other angles and three-dimensional circuit board assemblies, of both open and closed form, such as those forms shown in FIG. 8., can be conceived to provide a variety of mechanical construction and corresponding light output patterns. FIG. 8 is a schematic view illustrating various examples of cross-sections of various opened and closed geometrical embodiments of radial light source assemblies contemplated herein. FIG. 8 includes configurations of circuit board assembly array 10 including examples 802, 804, 806, 808, 810, 812, 814, 816, and 818. This set of examples is not exhaustive, and many other configurations are contemplated herein. The specific examples shown include arrays formed of varying numbers of circuit board assemblies. The specific examples shown also include arrays that form both open and closed shapes in cross-section. It will be appreciated that embodiments herein also include those where the width of individual circuit board assemblies varies, such as shown in example 816. In addition, in some embodiments, certain adjacent circuit board assemblies may be bent with respect to one another while other adjacent circuit board assemblies may be unbent with respect to one another (e.g., flat, within the same plane) such as that shown in example 812. In various embodiments, orientations of bending between adjacent circuit board assemblies may all be in the same direction, for example, all bending inward so that the array loops around to a starting point. However, in some embodiments, some orientations of bending between adjacent circuit board assemblies can be reversed (for example, outward vs. inward) such that portions of the array can assume a wavey or zig-zag pattern in cross-section. Thus, combining one or more described configuration options together, it will be appreciated that arrays herein can be configured to assume any polygonal shape in cross-section that is desired. In some embodiments, an array of circuit board assemblies can be formed such that some of the connections are bent inward and some of the connections are bent outward. In some embodiments, the array of circuit board assemblies can form a hyperbolic paraboloid.

Figure 26:
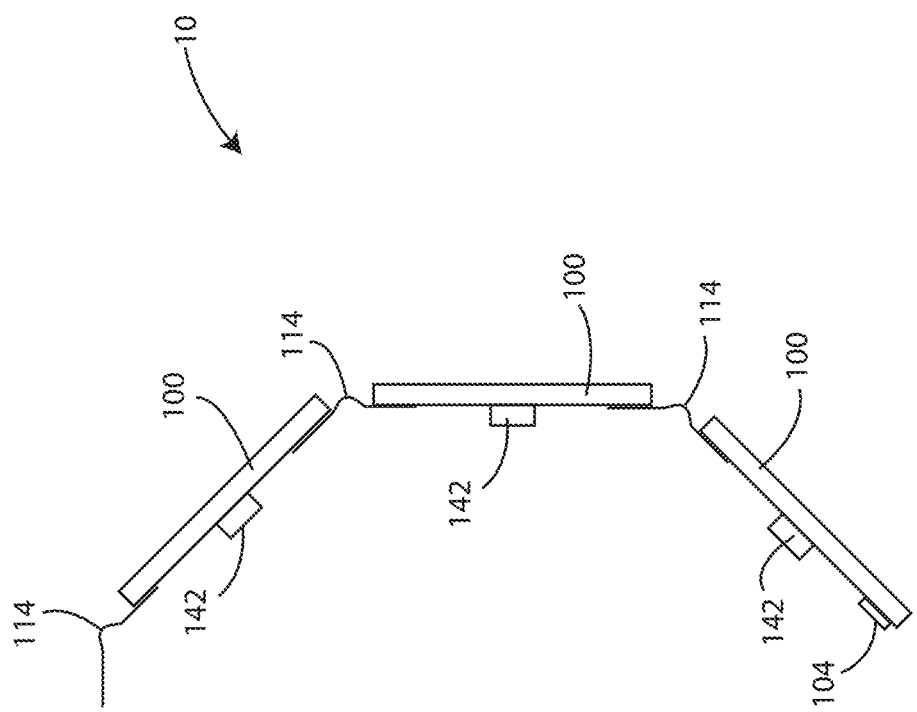
FIG. 26 is a schematic end view of an interconnectable circuit board array in accordance with various embodiments herein.

In some embodiments, the bending of adjacent circuit board assemblies can be in the same direction. For example, FIG. 26 shows three board assemblies 100 all bent inward relative to each other, and FIG. 18 shows a plurality of boards all being bent outwards relative to each other.

FIGS. 4A-4C show a gap 118 between two adjacent circuit board assemblies 100. FIGS. 4A-4C shows the gap 118 can have a consistent width along its length. The length of the gap can be perpendicular to the longitudinal axis of the circuit boards. In some embodiments, the length of the gap can be equivalent to the length of the circuit boards, when the circuit boards are arranged parallel to other. The width of the gap can vary. The width of the gap can be about 0.1, 0.5, 1, 1.5, 2, 2.5, 3, 3.5, 4, 4.5, 5, 8, 10 or 15 millimeters, or can be within a range wherein any of the foregoing can serve as the upper or lower bound of the range.

In reference to FIG. 4B and FIG. 4C, in various embodiments, one or more alignment tabs 1220 can be disposed between two adjacent circuit board assemblies 100, such as in the gap 118. The alignment tabs 1220 can be attached or coupled to each of the adjacent circuit board assemblies 100 that define a gap 118. The alignment tabs 1220 can be configured to keep the two adjacent circuit board assemblies in-line with each other, such that corresponding edges that define the gap 118 are parallel or the longitudinal axis of the two adjacent circuit board assemblies 100 are in-line with each other. The alignment tabs 1220 can be configured to maintain the size and shape of the gap 118 between two adjacent circuit board assemblies 100. The removal of the alignment tabs 1220 between two circuit board assemblies 100 can allow the circuit board assemblies 100 to be bent with respect to one another.

The length of a board to board connector can be longer than the distance between the two conductive pads 104 that the lateral side conductor is connected to, such as to allow the distance between the two conductive pads 104 to be modified. The board to board connectors can be bendable, flexible, or deformable (in some cases elastically deformable), such that the circuit boards can be bent into a three-dimensional, out of plane, configuration and then bent back into an in-plane configuration. In some embodiments, the circuit board assemblies 100 and the board to board connectors 114 can be flexible, such as to allow an array or strip of circuit board assemblies 100 to be wound around a reel or hub. In various embodiments, upon completing a strip of circuit board assemblies, the manufacturing process can include rolling up or winding the strip of circuit board assemblies around a reel, such as to make transportation of the strip of circuit board assemblies 100 more efficient. The strip of circuit board assemblies can be unwound from the reel and cut to length in the environment in which the circuit board assemblies will be installed.

Figure 34:
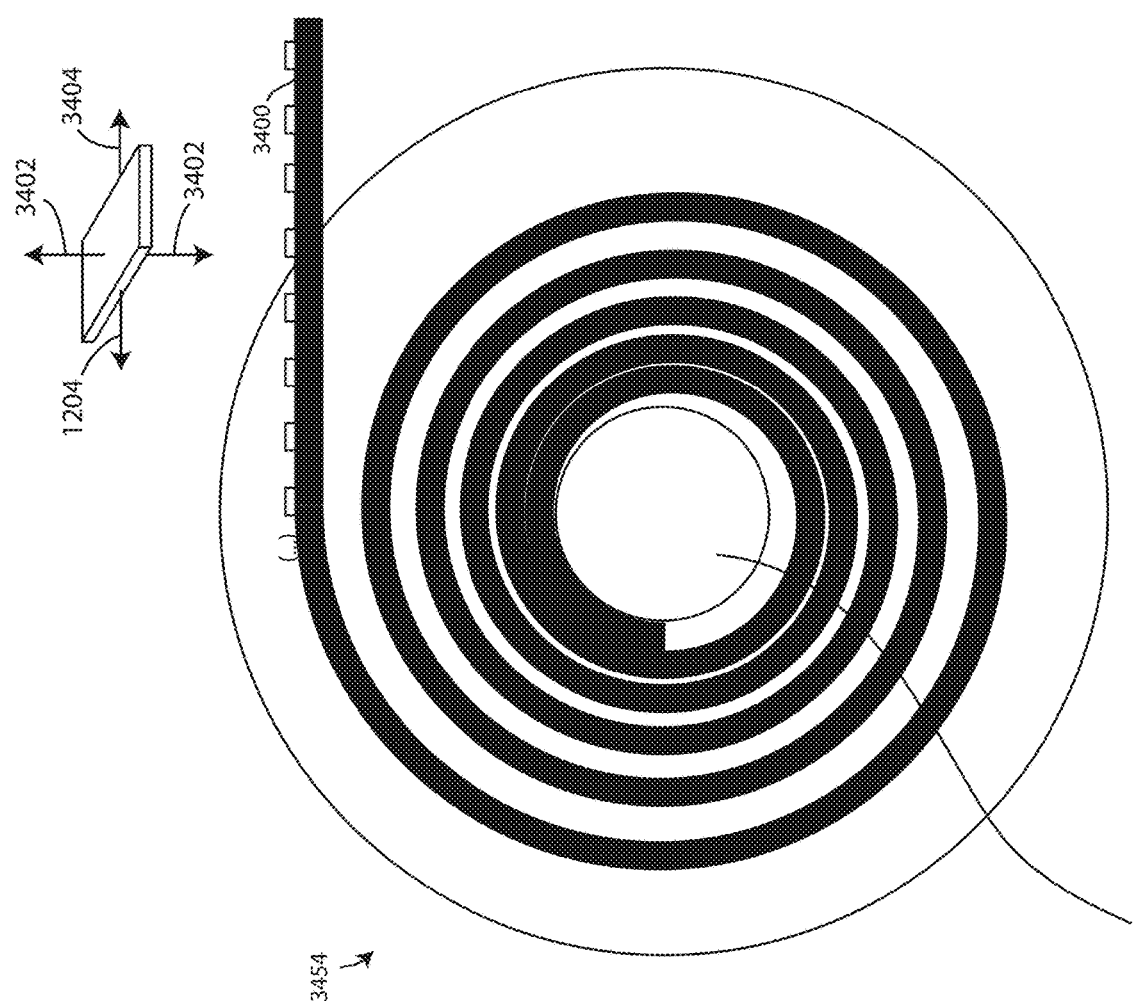
FIG. 34 is a schematic side view of a circuit board array being wound on a reel, according to an embodiment.

The structure of the circuit board assemblies 100 and the circuit board assembly arrays 10 can allow the circuit board assemblies 100 or array 10 to bend or curve around a latitudinal axis (e.g., in the direction of arrows 3402 versus lateral in-plane bending which is in the direction of arrows 3404) of the circuit board assemblies 100. FIG. 34 shows a side view of a circuit board array 3400 being wound on to the hub 3456 of a reel 3454. The circuit boards in the circuit board array 3400 shown in FIG. 34 are curved or bent around a latitudinal axis to allow the circuit board array 3400 to be wound around the hub 3456.

Bending or curving the circuit boards around a latitudinal axis allows the array to be wound around the hub 3456, such as during the manufacturing process of the circuit board array 100. Sections of the circuit board array 100 can be dispensed off of the reel 3454 as needed. The circuit board array 100 can be cut or separated into desired lengths. In various embodiments, a protective liner can be disposed below the circuit board assembly array 3400. The protective liner can separate portions of the circuit board assembly array 3400 from other portions of the circuit board assembly array that would be otherwise wound on top of or below the circuit board assembly array. In some embodiments, the wound-up circuit board assembly array can include a repeating sequence of a portion of the circuit board assembly array followed by a portion of the protective liner, such that each portion of the circuit board assembly array has a protective liner above and below the circuit board assembly after it has been would around the hub 3456. It should be understood that the outer most portion, or final layer of the circuit board assembly array can be provided without a protective liner disposed above it, since a subsequent portion of the circuit board assembly array is not disposed on top of it.

Providing the ability to wind the circuit board array around a hub can allow the arrays to be transported in a more efficient manner. Long arrays of circuit boards can be transported and cut to the desired length during an installation process. Various different arrays can be formed and wound around a hub to be sent to users. For example, if a manufacturer knows the user will use the array to create a three-sided shape, such as shown in FIG. 5A, an array with three circuit boards 100 across (shown in FIG. 17) can be created and wound around the hub. In other embodiments, an array with two, three, four, five, six, seven, eight, nine, or ten circuit board assemblies in the lateral direction can be created depending on the desired final shape.

Figure 6:
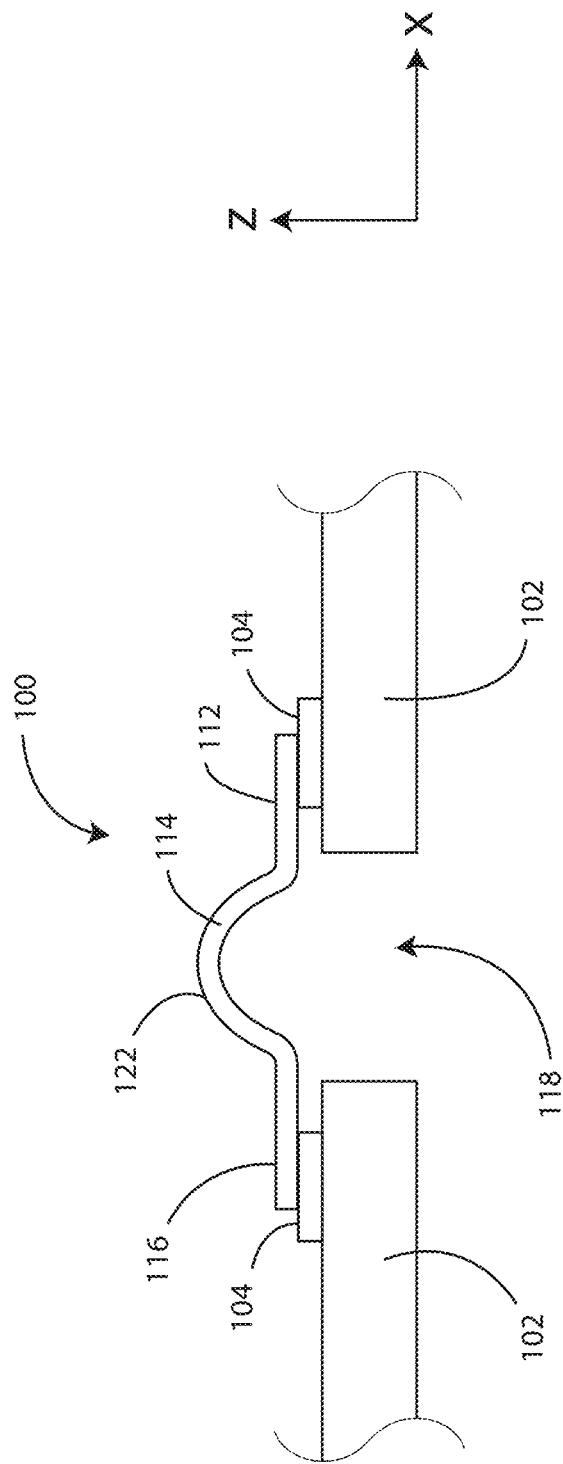
FIG. 6 is a schematic side view of two interconnectable circuit boards electrically coupled together with a board-to-board connector in accordance with various embodiments herein.
Figure 27:
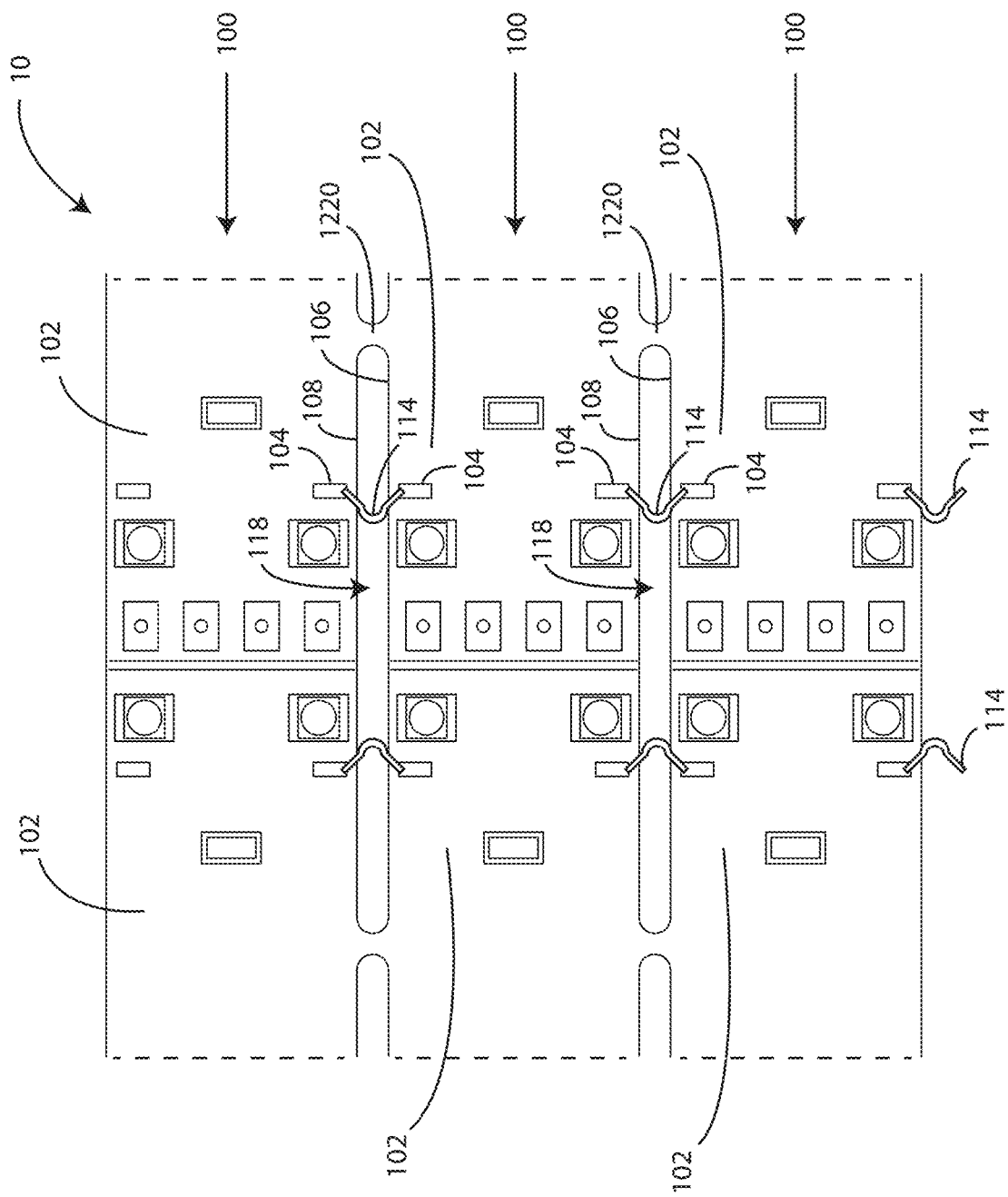
FIG. 27 is a schematic plan view of an interconnectable circuit board array with three circuit board assemblies in accordance with embodiments herein.
Figure 28:
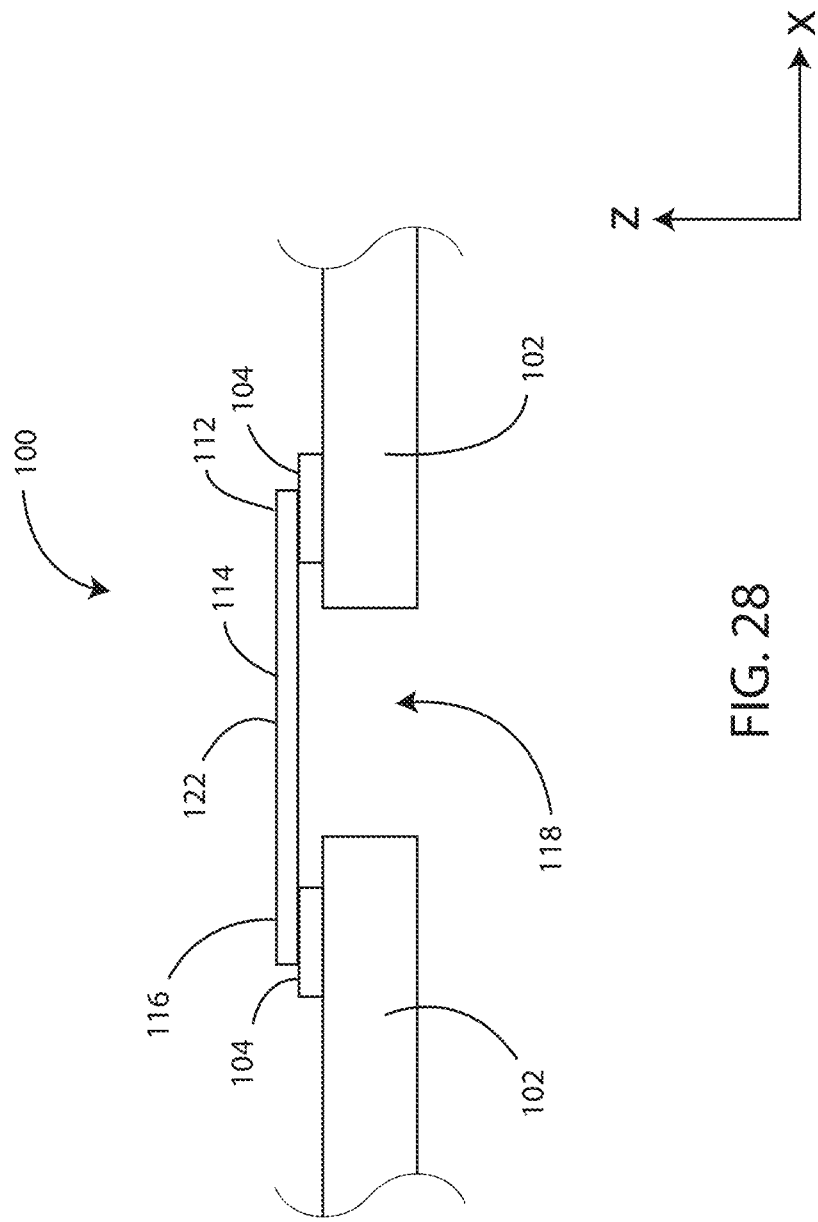
FIG. 28 is a schematic side view of two interconnectable circuit boards electrically coupled together with a board-to-board connector.

In some embodiments, such as in reference FIG. 6, the board to board connectors 114 can include at least two linear segments connecting at an angle, such as to form an angled shape. In various embodiments, the board to board connectors 114 can include a curved portion 122. The curved portion 122 can be curved inward or outward relative to a transverse axis of the circuit boards. In some embodiments, the curved portions 122 can exhibit curvature of at least 15, 30, 45, 60, 75, 90, 105, 120, 135, 150, 165 or at least 180 degrees, or an amount of curvature falling within a range between any of the foregoing. FIG. 27 shows a plurality of circuit board assemblies 100 joined with board to board connectors 114. The board to board connectors can lie flat within the plane of the boards. The board to board connectors can be arranged such that the curved portion is parallel with the top of the boards or adjacent to the top of the boards, such as shown in FIG. 28. In contrast, FIG. 6 shows the curved portion is perpendicular to the top of the boards. The board to board connectors 114 can be arranged in any configuration between parallel with the board and perpendicular to the board. The board to board connectors 114 can include a first lateral side conductor 112 and a second lateral side conductor 116. The first lateral side conductor 112 can be connected to the second lateral side conductor 116 with a curved portion 122. A connector 114 can be monolithic or one continuous piece of material.

In some embodiments, the curved portions 122 are configured to allow clearance of a cutting tool to provide access to the alignment tabs 1220 for removal. The placement of the conductive pad 104 can be further from the alignment tabs 1220 of the circuit boards to allow the removal of the alignment tabs 1220 without affecting the lateral side conductors of the board to board connectors 114. In this manner, a cutting instrument inserted into the gap 118 between the circuit board assemblies 100 will encounter the alignment tabs 1220 before the nearest board to board connector 114. This can facilitate quick and easy removal of the alignment tabs 1220.

Figure 9:
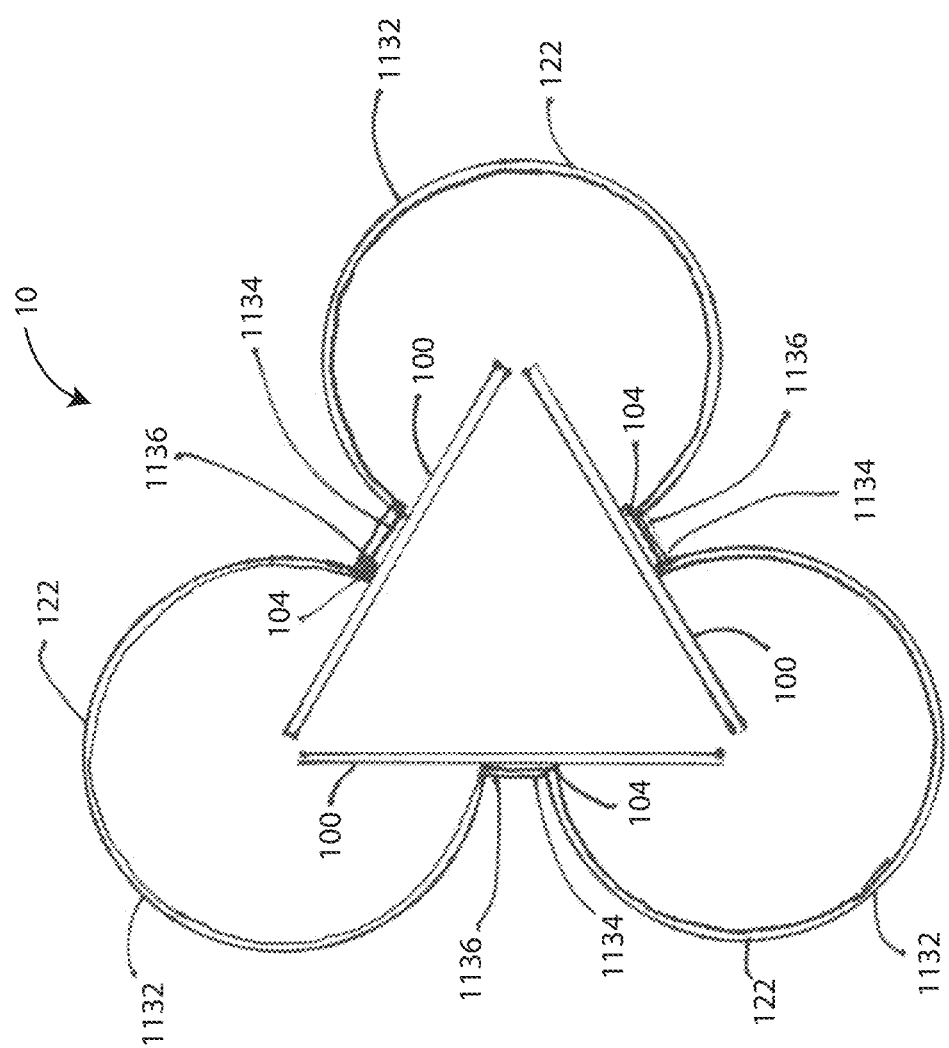
FIG. 9 is a schematic end view of a three-dimensional triangular circuit board array with a continuous board to board connector in accordance with various embodiments herein.

In at least one embodiment, such as that depicted in FIG. 9, a board to board connector 1132 can be constructed from a single continuous piece with lateral ends 1134 and 1136. Lateral ends 1134 and 1136 are electrically and mechanically connected to circuit board assemblies 100. The circuit board assemblies 100 can include a conductive pad 104 on each of a plurality of circuit board assemblies 100. The curved portion 122 of the board to board connector 1132 can be formed to provide a three-dimensional circuit board assembly array 10. Circuit board connectors 1132 can be placed along the three-dimensional circuit board assembly array 10 to provide electrical connection for the electrical circuit.

Figure 7:
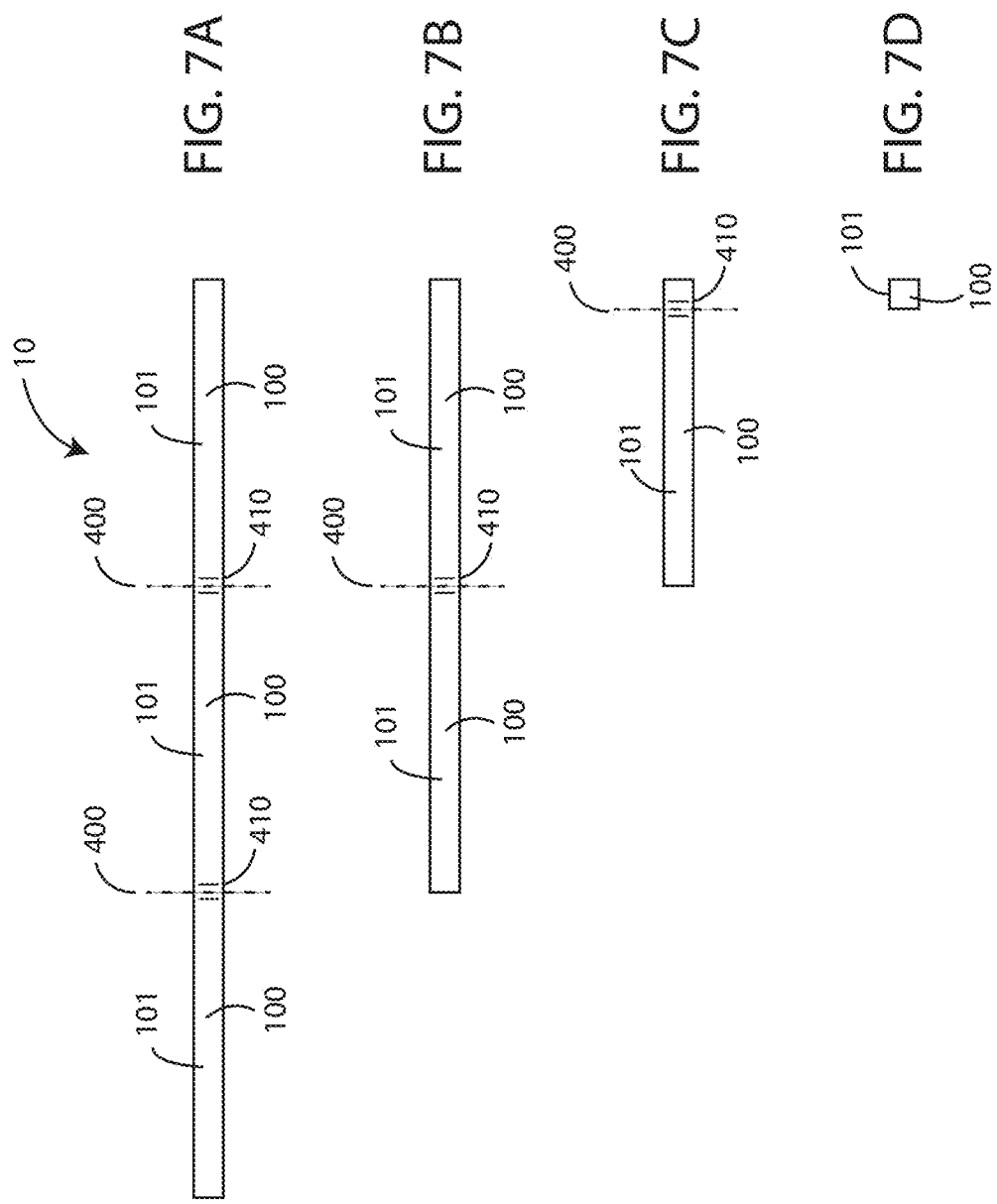
FIGS. 7A-7D are schematic views of a plurality of extended linear three-dimensional circuit board assemblies cut to differing lengths in accordance with various embodiments herein.

FIG. 7A depicts a plurality of circuit board assemblies 100 assembled into an extended linear form 101 to produce an extended linear three-dimensional circuit board assembly array 10. The plurality of circuit board assemblies 100 can contain a set of identifying marks 410 marking a cut location 400. The cut locations 400 are placed such as to allow a cutting tool to enter between a gap, as previously shown, and remove a portion or full electrical circuit of a circuit board assembly 100 from the circuit board assembly array 10. Additional circuit board assembly array portions can be removed from each side of a three-dimensional circuit board assembly array 10 in order to produce a shorter extended linear three-dimensional circuit board assembly array 10, such as that shown in FIGS. 7B, 7C, and 7D.

In various embodiments, the extended linear three-dimensional circuit board assembly array 10 can be 0.3, 0.5, 1, 2, 3, or 4 meters in length or any length falling within any of the foregoing. The extended linear three-dimensional circuit board assembly array 10 can be shortened to less than the original length by 5, 10, 15, 25, 100, 500, or 1000 millimeters, or a length falling within a range between any of the foregoing.

In other embodiments, a segment of a linear three-dimensional circuit board assembly array 10 can be removed from an extended linear three-dimensional circuit board assembly array 10 at the cut location 400 to form a functional circuit board assembly array 10 of 9.5, 12.7, 25.4, 50.8, 100, 500, 1000 or 3995 millimeters in length, or a length falling within a range between any of the foregoing.

Figure 10:
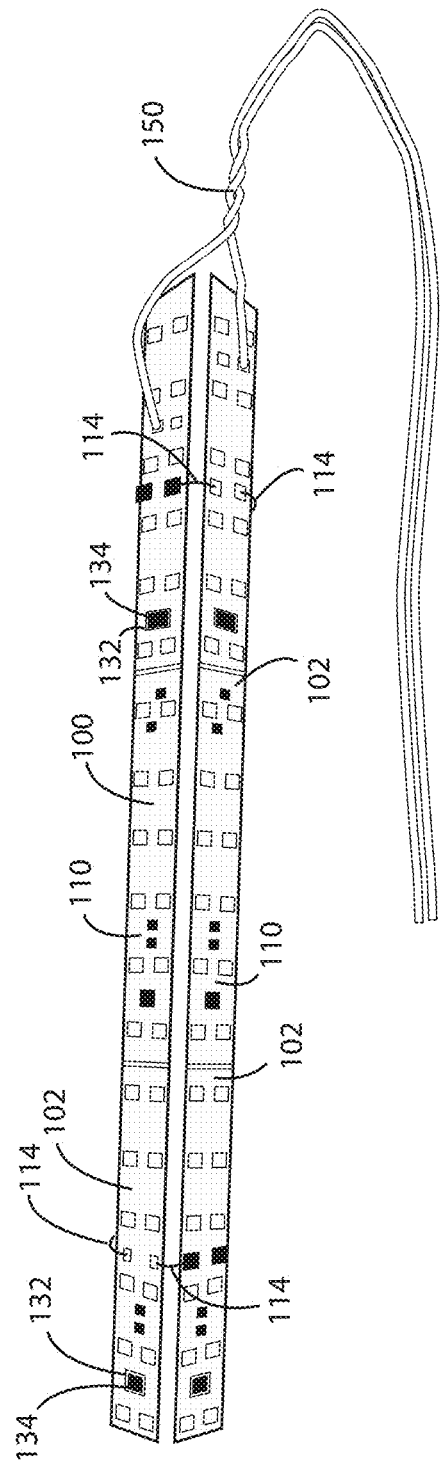
FIG. 10 is a perspective view of an interconnectable circuit board array forming a triangular radial light source assembly in accordance with various embodiments herein.

Referring now to FIG. 10, a perspective view of an interconnectable circuit board array is shown forming a triangular radial light source assembly in accordance with various embodiments herein. In FIG. 10, a plurality of circuit board assemblies 100 are electrically and mechanically connected together with a plurality of board to board connectors 114 and formed into a three-dimensional circuit board assembly array 10. A set of electrical wires 150 are attached to one or more of the circuit board assemblies 100 in order to provide an electrical path for power to the three-dimensional circuit board assembly array 10.

The three-dimensional circuit board assembly array 10 can include a plurality of LEDs on each top surface 110 of the circuit board assemblies 100. The light output from the LEDs can form a Lambertian pattern of light emitting radially outward from each LED location. The radial light pattern from each LED can overlap with the radial light output pattern of each LED from an adjacent circuit board assembly 100. When configured in a three-dimensional triangle, the overlapping light output pattern can produce a 360-degree radial pattern of light.

In the embodiment shown in FIG. 10, all three sides of the three-dimensional circuit board assembly array 10 are driven from a single pair of conductive wires 150. However, in other embodiments, the three sides of the three-dimensional circuit are electrically powered from independent pairs of conductive wires 150. In another embodiment of a three-dimensional circuit board assembly array 10 herein, the circuit board assemblies 100 with conductive pads are not populated with electrical components 134 creating two independent conductive paths for two independent pluralities of LEDs 142. The circuit board assemblies 100 populated with electrical board to board connectors 114 can be configured such that each independent plurality of LEDs 142 on each face of the three-dimensional circuit board assembly array 10 are electrically powered from independent pairs of conductive wires 150. In this manner independent control of multiple pluralities of LEDs on a single facet of the three-dimensional circuit board assembly array 10 can be achieved and each independent plurality of LEDs can be electrically connected to a similar independent plurality of LEDs 142 on another facet of the three-dimensional circuit board assembly array 10.

Figure 13:
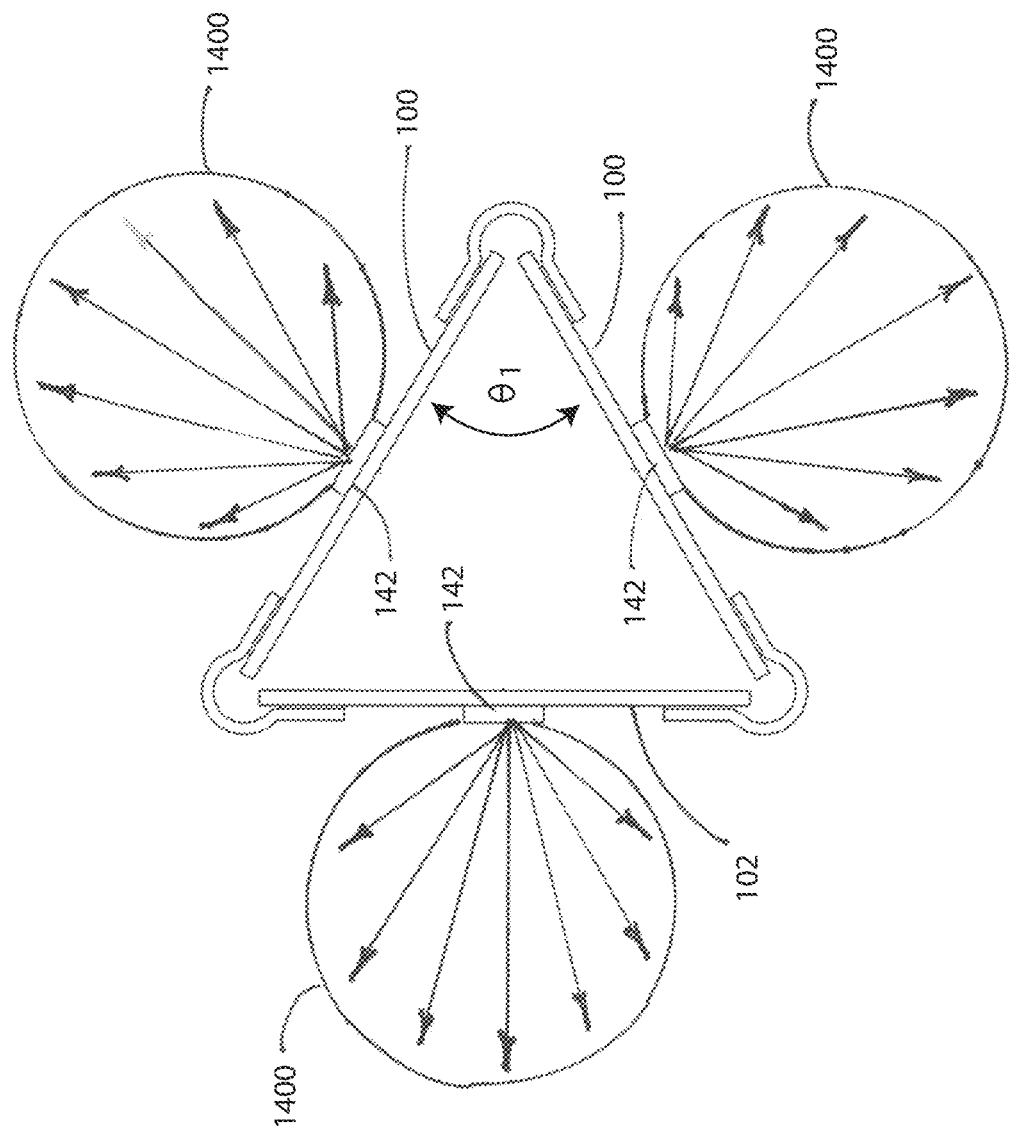
FIG. 13 is a schematic end view of a 360-degree radial overlapping Lambertian light pattern of a three-sided triangular radial light source in accordance with embodiments herein.
Figure 14:
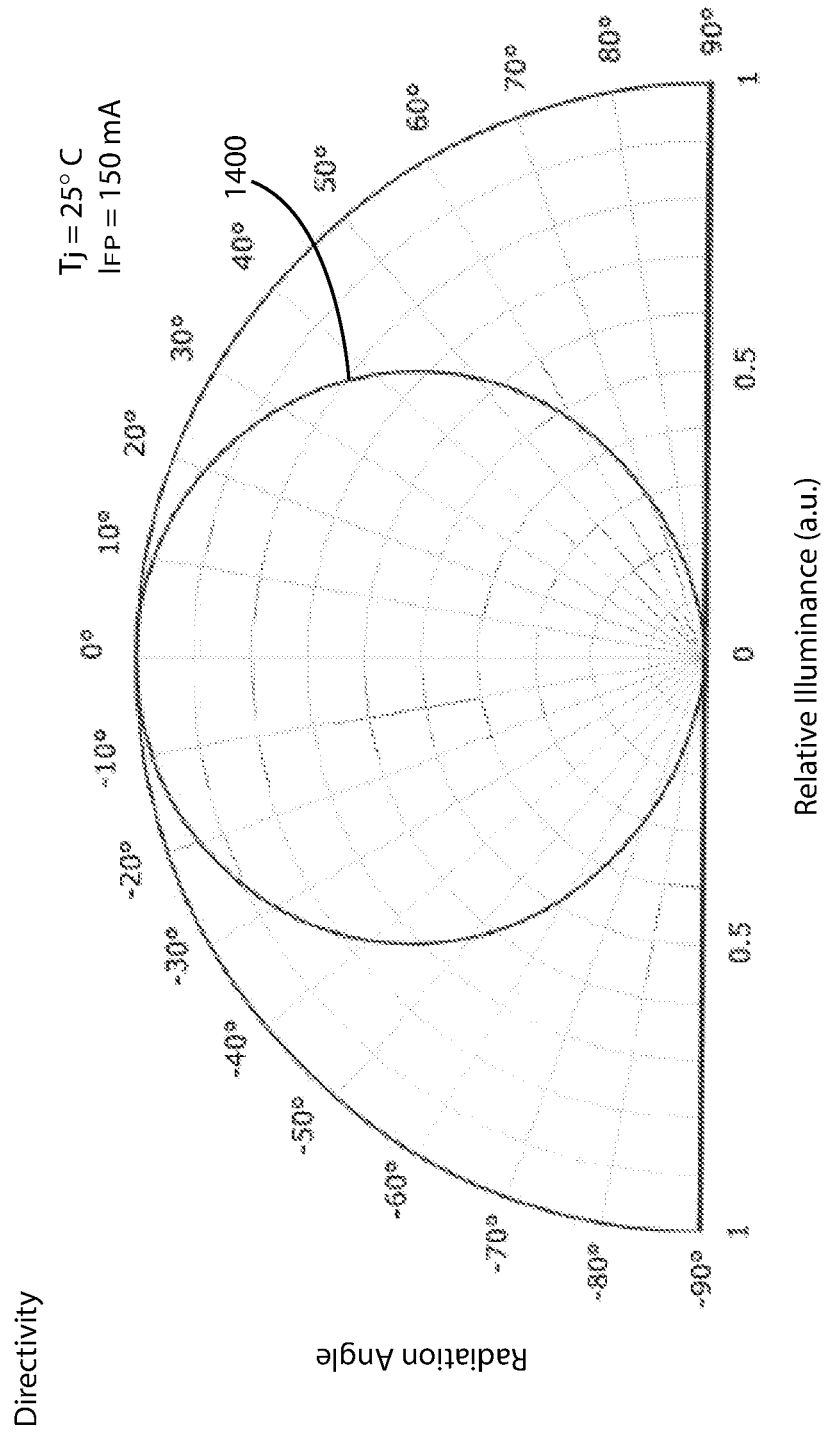
FIG. 14 is a graph showing a typical Lambertian pattern relative illuminance over angle in accordance with embodiments herein.

Referring now to FIG. 13, a schematic end view of a 360-degree radial overlapping Lambertian light pattern of a three-sided triangular radial light source is shown in accordance with embodiments herein. In the embodiment of FIG. 13 the circuit board assemblies 100 are formed into an equilateral triangle with an angle $\theta_1$ of 60 degrees between the lateral planes of each of the circuit board assemblies 100 in the three-dimensional circuit board assembly array 10. The light output pattern of each outward facing plurality of LEDs 142 can be an approximately 120 degree Lambertian pattern, as shown here for reference in FIG. 14, being an approximate 120 degree Lambertian pattern 1400 with the radial axis of symmetry of the Lambertian pattern 1400 pointing outward from the center of the LED. The light output pattern of each LED 142 on the circuit board assembly 100 arranged in an equilateral triangle with each at an angle of 120 degrees from the radial axis of symmetry of the Lambertian patterns 1400 of the LEDs 142 on the adjacent circuit board assemblies 100. The 120 degree Lambertian pattern 1400 can have a relative illuminance of 1.0 along its radial axis of symmetry and a relative light output of 0.5 relative illuminance at approximately 60 degrees from the radial axis of symmetry. Placed in this configuration, the resulting relative illuminance of the 360-degree radial light output pattern of the three-dimensional circuit board assembly array 10 can be a uniform illuminance pattern to 15% variation across a lateral plane, transverse to the longitudinal axis of the three-dimensional circuit board assembly, as shown in FIG. 15.

Figure 15:
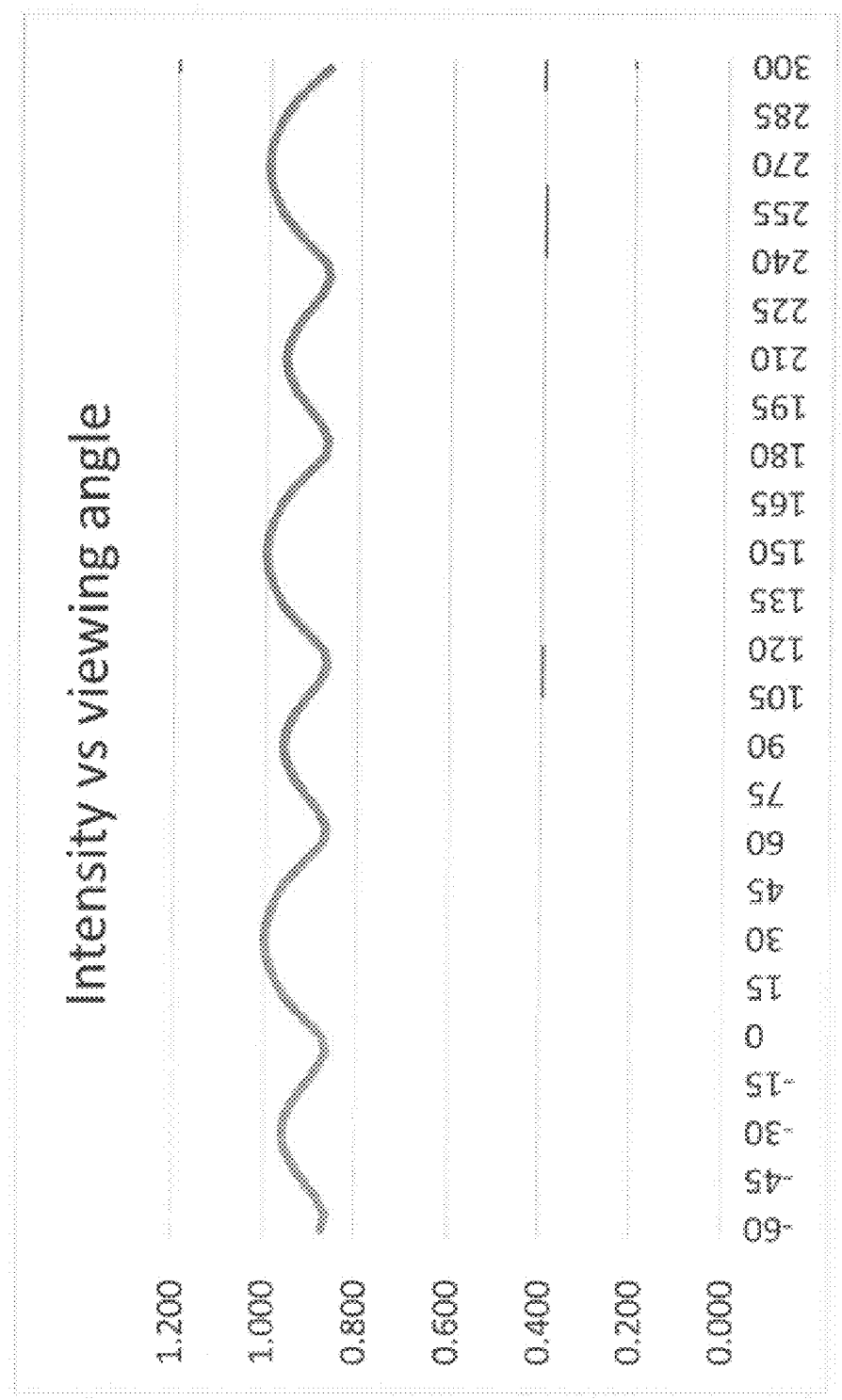
FIG. 15 is a graph showing a uniform 360-degree light source illuminance pattern for a three-sided triangular radial light source with all three sides illuminated and producing light in accordance with embodiments herein.
Figure 16:
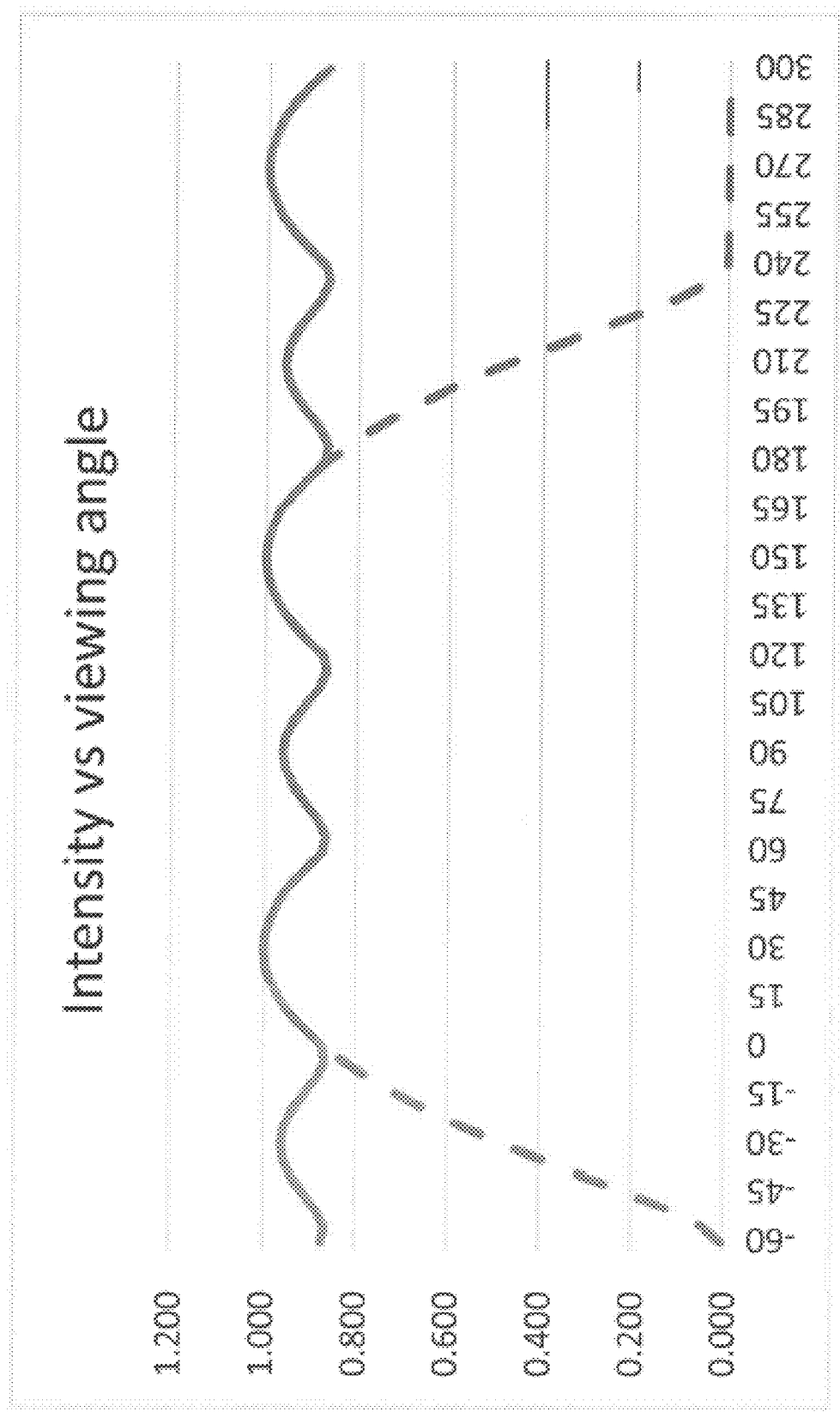
FIG. 16 is a graph showing a 360-degree light source illuminance pattern for a three-sided triangular radial light source with two sides illuminated as overlayed against three sides illuminated and producing light in accordance with embodiments herein.

Referring to FIG. 10, the triangular circuit board assembly 10, when electrical power is supplied to each circuit board assembly 100 either via independent wire pairs 150 or via a single wire pair and 150 and electrical conductive board to board connectors 114 on conductive pads 104, produces a uniform 360-degree pattern as shown in FIG. 15 and repeated on FIG. 16 for reference.

However, other illumination patterns are also contemplated herein. For example, referring again the triangular circuit board assembly 10 of FIG. 10, consider the configuration when electrical power is supplied to only two of the circuit board assemblies 100 either via independent wire pairs 150 or via a single pair of electrical wires 150 and conductive board to board connectors 114 connected to conductive pads 104 so as to electrify only two of the three sides with additional conductive board to board connectors 114 connected to conductive pads 104 so as to only provide mechanical attachment to the third circuit board assembly 100. The third circuit board assembly 100 is able to accept a single independent wire pair 150 or constructed with no electrical components or electrical connection. In this configuration, the triangular circuit board assembly 10, when electrical power is supplied to only two of the circuit board assemblies 100, produces a uniform illumination pattern, FIG. 16, from 0 to 180 degrees and a diminishing illumination pattern through 60 degrees on either side of the 180 degree uniform pattern covering a 300 degree pattern and virtually no illumination through the remaining 60 degrees of a full 360 degree pattern.

In some embodiments, a circuit board assembly array 10, including a plurality of circuit board assemblies 100 assembled into a three-dimensional circuit board assembly array 10 and forming a radial light source, can be placed, at least partially, over, around or on a support structure 200, such as a core. In some embodiments, the support structure 200 can be in the form of a cylinder, a hollow tube, rectangular prism or the like. In some embodiments, the support structure can be in the form of a spacer or a carrier. The circuit board assemblies 100, when connected to electrical power via electrical conductor wire or wire leads 128 generate electromagnetic energy (light out) and thermal energy (heat). The thermal energy being generated can be dissipated primarily through conduction to the back surface of the bottom layer 1148 of the layered structure.

Figure 29:
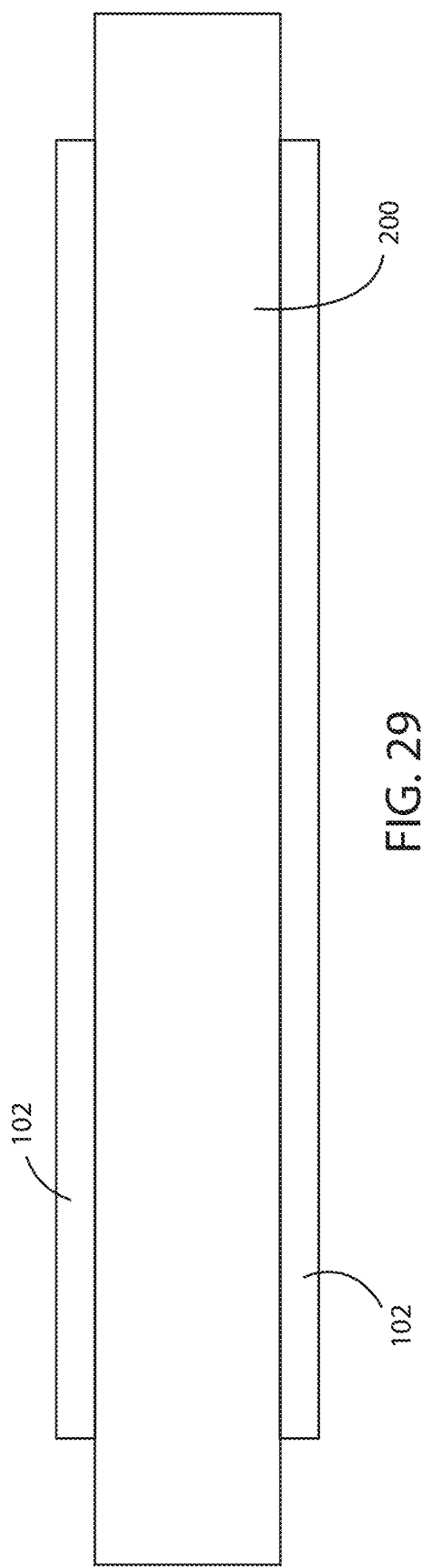
FIG. 29 is a schematic cross-sectional view of a circuit board array around a support structure in accordance with various embodiment herein.
Figure 30:
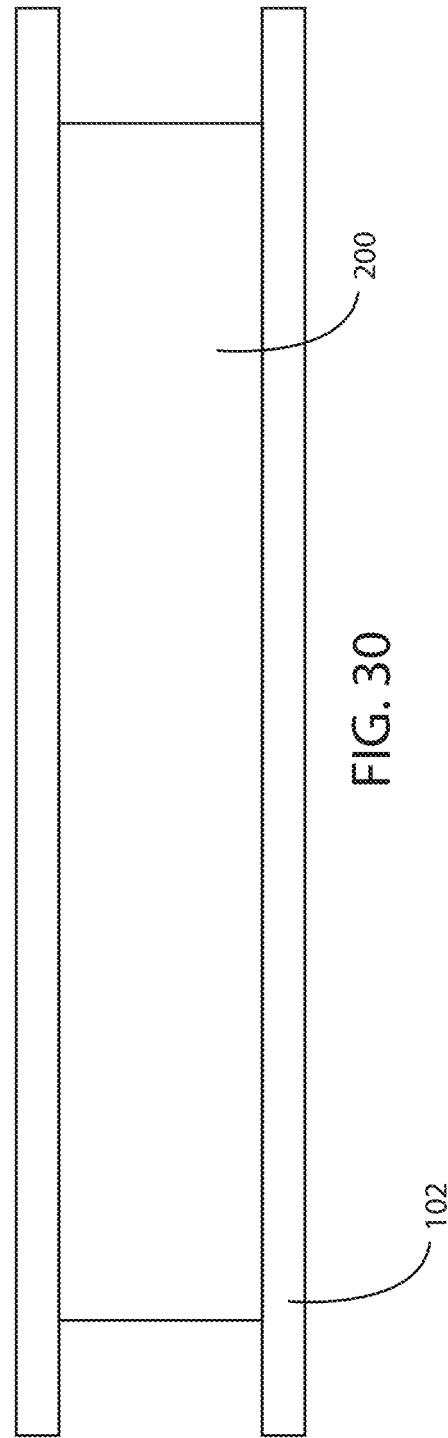
FIG. 30 is a schematic cross-sectional view of a circuit board array around a support structure in accordance with various embodiment herein.
Figure 31:
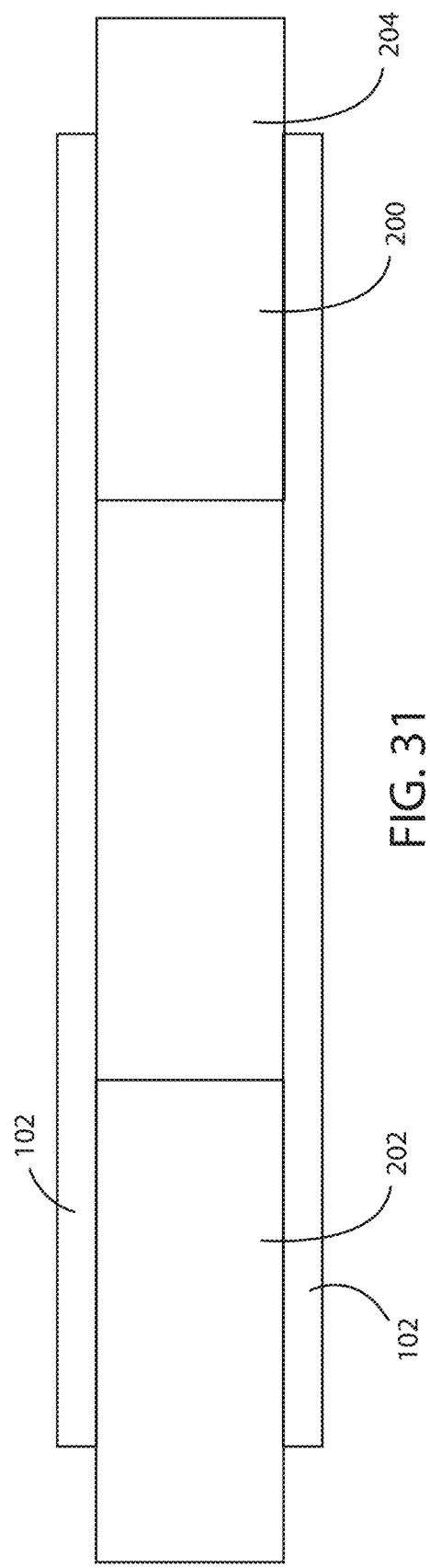
FIG. 31 is a schematic cross-sectional view of a circuit board array around a support structure in accordance with various embodiment herein.

In reference now to FIGS. 29-31, various different cross-sectional views are shown of a circuit board assembly 100 around a support structure 200 in accordance with various embodiments. In some embodiments, the support structure 200 can be a single continuous element, such as shown in FIGS. 29 and 30. In other embodiments, the support structure 200 can include two or more non-connected portions 202, 204, such as shown in FIG. 31.

In some embodiments, the support structure 200 can be within the circuit board assembly 100, such that the support structure 200 does not extend past both ends of the circuit board assembly as shown in FIG. 30. In other embodiments, the support structure 200 can have a length longer than the circuit board assembly 100, such that at least one end extends past the end of the circuit board assembly 100. In some embodiments, both ends of the support structure 200 can extend past the two ends of the circuit board assembly 100, such as shown in FIGS. 29 and 31.

In some embodiments, tension can be used to effectively secure the board assembly array 10 within a diffuser or other housing. In some embodiments, the support structure 200 can take the form of a threaded rod. In some embodiments, the threaded rod or other support structure can pass through the ends of a diffuser. End caps can be screwed on both securing ends of the rod and generate tension in the board assembly array thereby securing the board assembly array within the diffuser.

In various embodiments, at least some of the circuit board assemblies 100 can include a layered structure 1142, such as described in U.S. patent application Ser. No. 12/043,424 filed on Mar. 6, 2008, issued as U.S. Pat. 8,143,631, which is herein incorporated by reference in its entirety.

Figure 11:
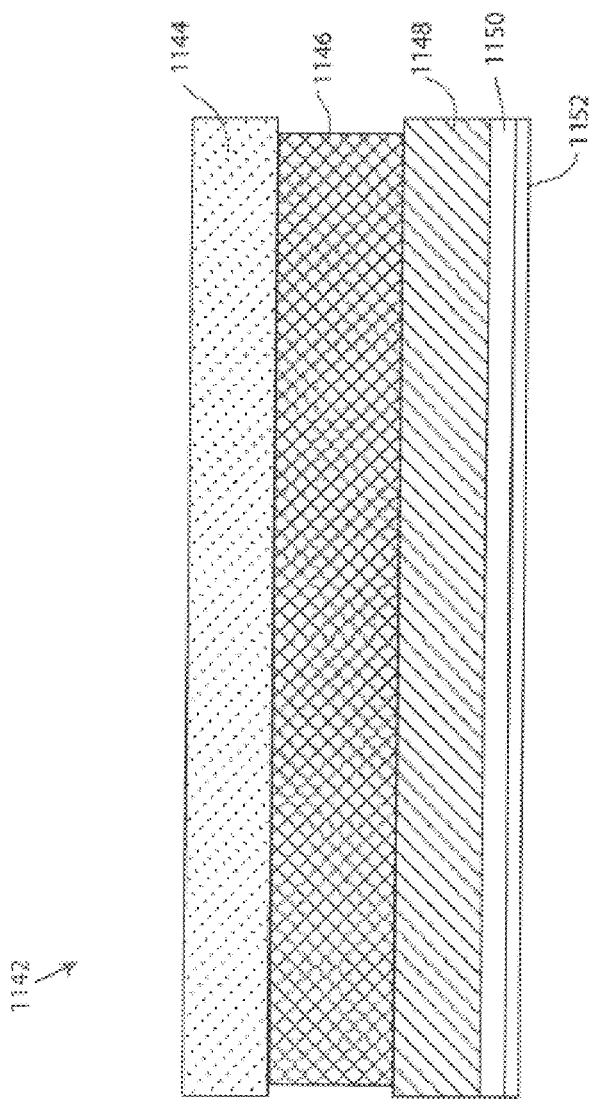
FIG. 11 is a schematic cross-sectional view of a layered structure that can form at least a portion of an interconnectable circuit board in various embodiments herein.

FIG. 11 shows a cross-sectional side view of a circuit board assembly 100 and/or circuit board portion 102 showing the layered structure 1142. The layered structure 1142 can include an electrically insulating layer 1146 interconnecting a top layer 1144 and a bottom layer 1148. In various embodiments, the conductive pads or component pads (shown in other views) can be located on the top layer 1144. In some embodiments, one or more circuit board assemblies 100 can include an adhesive layer 1150 on an opposite surface from the conductive pads or component pads. Further, there can be a backing layer 1152 covering the adhesive layer 1150. The backing layer 1152 can be removed from the adhesive layer 1150 to expose the adhesive layer 1150, such as prior to attaching the circuit board assembly 100 to a surface via the adhesive layer 1150.

In various embodiments, the top layer 1144 and the bottom layer 1148 can be electrically conductive layers. The electrically conductive layers can include copper. In some embodiments, the electrically insulating layer 1146 can include a fiberglass composite material.

Figure 12:
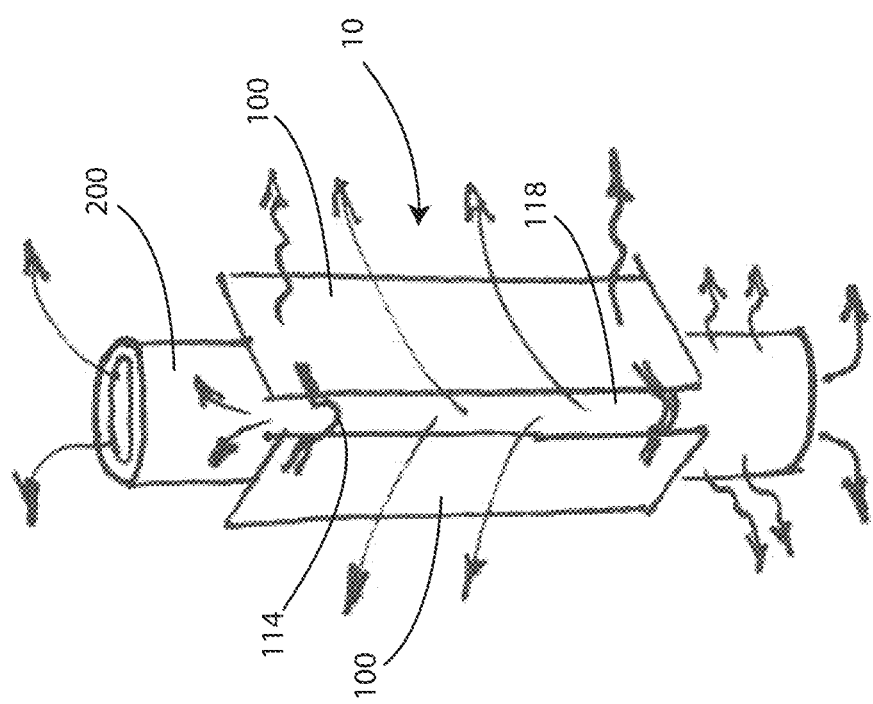
FIG. 12 is a schematic view of thermal dissipation paths for an electrically powered 360-degree radial light source assembly in accordance with embodiments herein.

Referring to FIG. 12 as an example, the three-dimensional circuit board assembly array 10, when constructed and connected together electrically and mechanically with board to board connectors 114 and inserted onto a support structure 200, in this embodiment in the form of a hollow tube, and sized so an internal diameter is slightly smaller than the support structure 200 outer diameter. As such, the three-dimensional circuit board assembly array 10 can produce a compressive force on the support structure 200 resulting in a friction force between the support structure 200 and three-dimensional circuit board assembly array 10. The friction force can be sufficient to retain the three-dimensional circuit board assembly array 10 onto the support structure 200 under normal handling.

The three-dimensional circuit board assembly array 10 in one embodiment can have a mass of less than 6 oz per linear foot. The static friction force between the support structure 200 and three-dimensional circuit board assembly 100 can be, in some embodiments, approximately 13.92 oz per linear foot or more than 2× the necessary force to retain the three-dimensional circuit board assembly 100 to the support structure 200.

Further in reference to FIG. 12, the circuit board assembly array 10 includes a plurality of circuit board assemblies 100 when assembled into a three-dimensional circuit board assembly array 10 and placed over a support structure 200 and when connected to electrical power via an electrical conductor wire generate electromagnetic energy (light out) and thermal energy (heat). The thermal energy being dissipated from the LEDs is primarily through conduction to top surface of the layered structure 1142 (shown in FIG. 11). From the top surface, the thermal energy is conducted through the layered structure 1142 to the back surface of the bottom layer 1148 of the layered structure 1142 (all shown in FIG. 11). The thermal energy can further be conducted from the thermally conductive back surface of the bottom layer 1148 of the layered structure 1142 to the outer thermally conductive surface of the support structure 200.

The thermal energy can further be dissipated through thermal convection passing through the gap 118 between the circuit board assembly 100 and the adjacent circuit board assembly 100. Additionally, thermal energy is dissipated through thermal convection off both the thermally conductive back surface of the bottom layer 1148 of the layered structure 1142 to the air in the gap between the circuit board assembly 100 and the support structure 200 and off the thermally conductive front surface or top layer 1144 to the ambient air surrounding the circuit board assembly array 10.

In various embodiments, the circuit board assembly array 10 can be self-supporting, such that it does not require a support structure 200 to maintain its shape. In various embodiments, the self-supporting circuit board assembly array 10 can be provided without a heat sink. A heat sink can be avoided in various embodiments, in part, as a result of free air that pass by, around, over, or through the circuit board assembly array 10.

Figure 20:
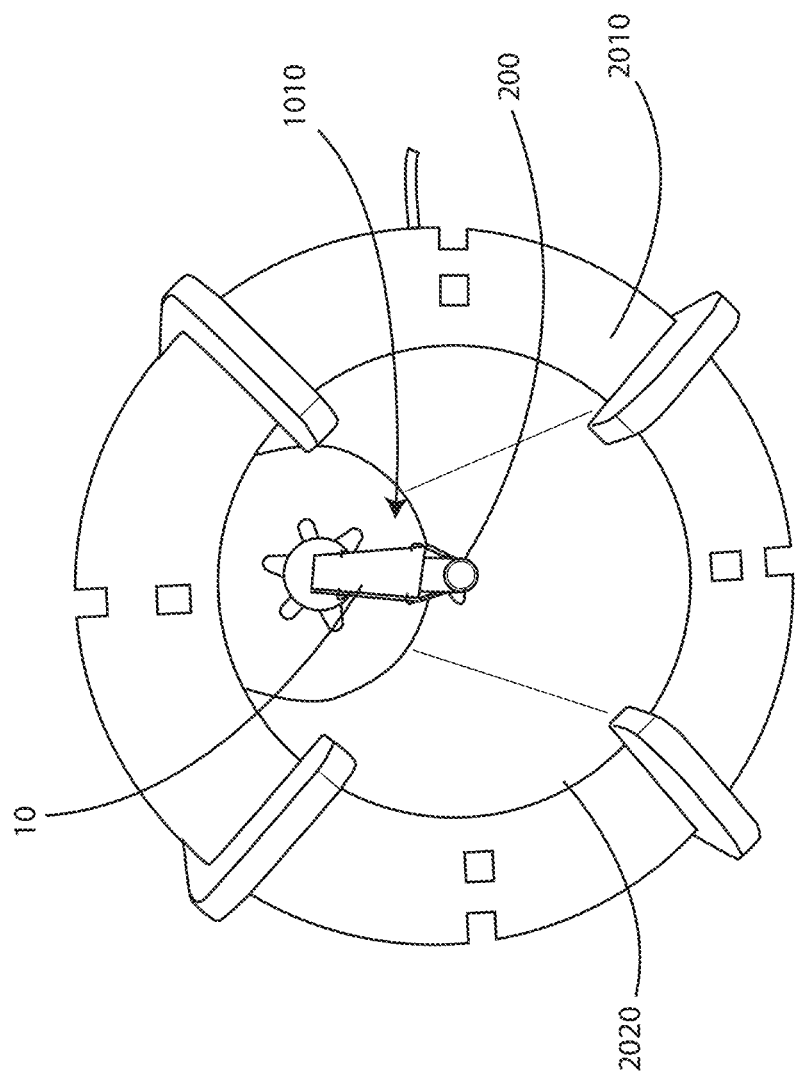
FIG. 20 is a perspective view of a radial light source assembly mounted vertically in a cylindrical light fixture in accordance with various embodiments herein.

In some embodiments, the thermal dissipation of a radial light source (when constructed with a triangular shaped three-dimensional circuit board assembly array 10 and attached to a support structure 200 by friction force and mounted vertically inside of a cylindrical light fixture 2010 (as shown in FIG. 20) demonstrated the ability to dissipate sufficient heat in ambient room temperature of 22 degrees Celsius to be powered at up to 18 W per linear foot while maintaining an Tc temperature on the LEDs of less than 85 degrees Celsius. The Tc temperature of less than 85 degrees Celsius providing for L70 light output performance. The radial light source assembly 1010 can be mounted to the support structure 200 in such a way as to avoid any interference with the 360-degree radial light output pattern.

The radial light source assembly 1010, can be mounted vertically down the longitudinal axis of symmetry of a cylindrical light fixture 2010 as shown in FIG. 20. The cylindrical light fixture 2010 can include an outer cylindrical diffuser 2020. The light output pattern of the radial light source assembly 1010 can provide a linearly uniform light source along the length of the cylindrical diffuser 2020. Referring now to FIG. 22, a perspective view of two cylindrical light sources is shown. One of the cylindrical light sources 2202 includes an interconnectable circuit board array forming a radial light source assembly in accordance with embodiments herein and the other 2204 with a standard A19 LED lamp source mounted in the same cylindrical light fixture with the same cylindrical diffuser.

Figure 32:
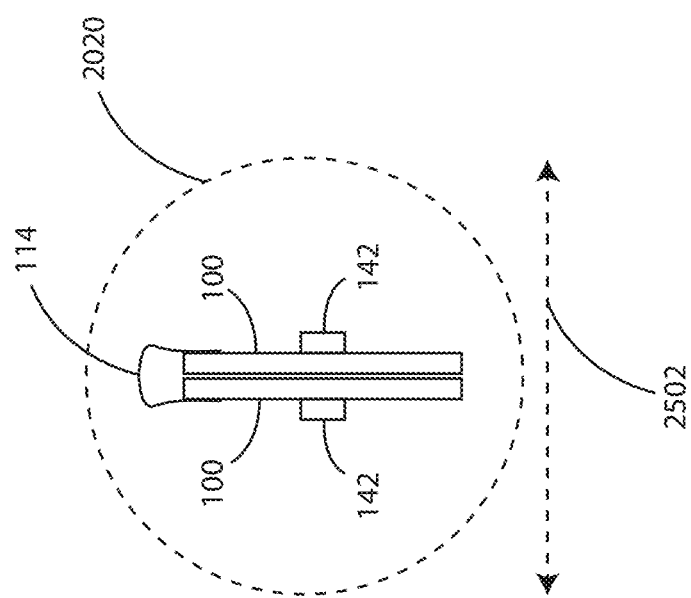
FIG. 32 is a schematic end view of a circuit board array in accordance with various embodiments herein.
Figure 33:
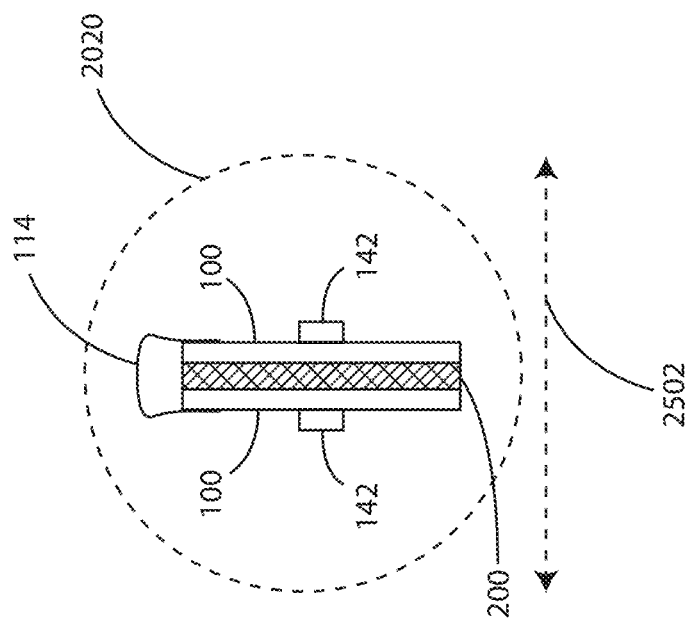
FIG. 33 is a schematic end view of a circuit board array in accordance with various embodiments herein.

In some embodiments, a first board assembly 100 can be arranged back-to-back with a second board assembly 100, such as shown in FIG. 32. In some embodiments, the boards can be arranged back-to-back with a support structure 200 or carrier disposed between the boards for support, as shown in FIG. 33. In some embodiments, the support structure 200 can include a conductive material, such as copper or another metal. In other embodiments, the support structure 200 can include a non-conductive material. The first board assembly 100 can be rotated 180 degrees from an inline starting position with the second board assembly 100 resulting in the two boards being back-to-back and still connected with the connector 114. The assembly including two back-to-back boards can provide consistent light in 360 degrees. The assembly of two boards can be disposed within a diffuser 2020. In some embodiments, the diffuser 2020 can be a cylinder. The cylinder can have a diameter 2502 of about 0.5 inches, 1 inch, 1.5 inches, 2 inches, 3 inches, 4 inches, or 5 inches, or a diameter falling within a range between any of the foregoing.

Figure 21:
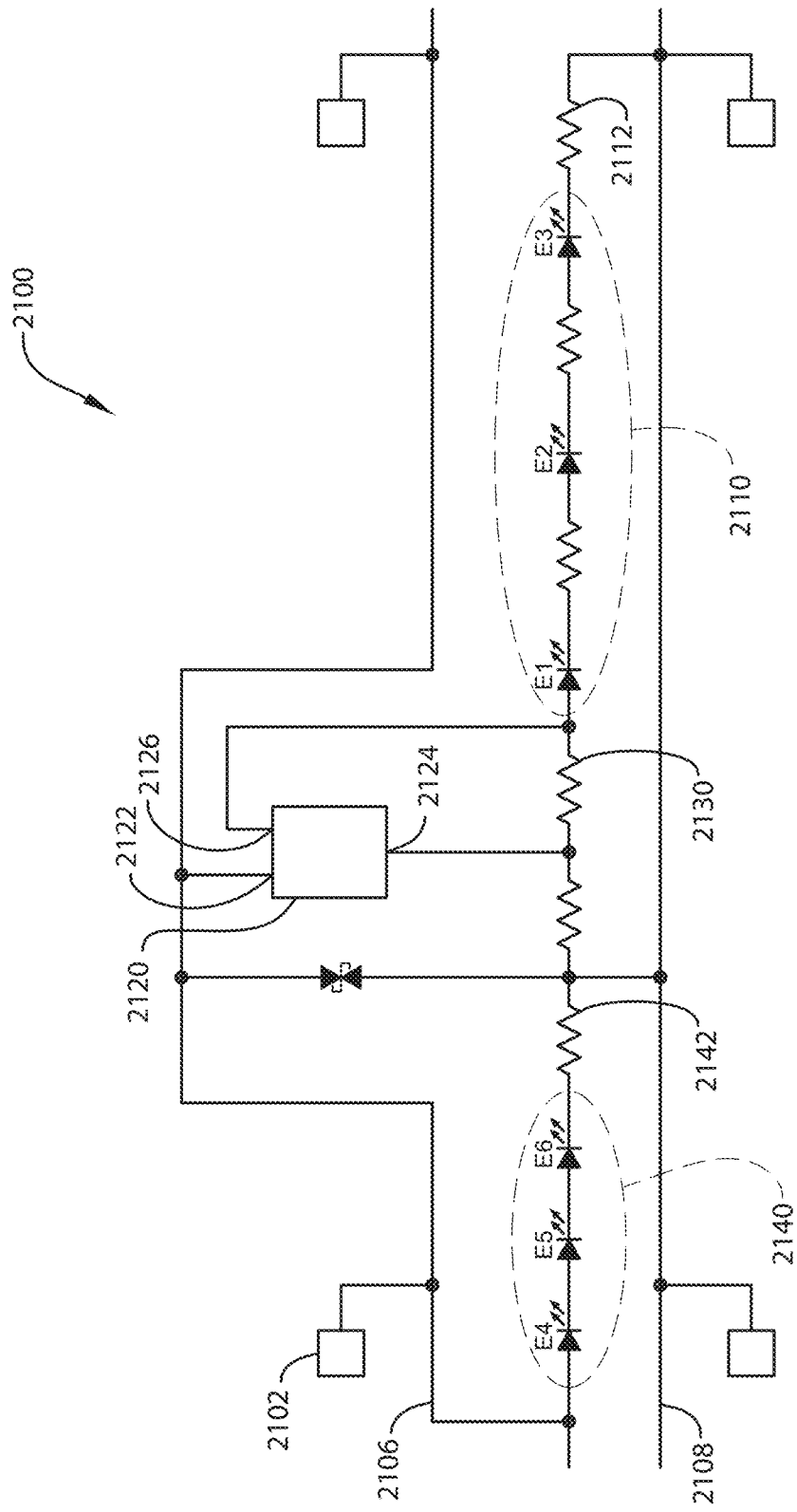
FIG. 21 is a schematic view of an electrical circuit for changing the color of light emission in accordance with various embodiments herein.

Circuit board assemblies herein can include various electrical circuits. Referring now to FIG. 21, a schematic view of an electrical circuit is shown for changing the color of light emission. At least some of the circuit board assemblies herein can include a circuit 2100, such as that described in U.S. patent application Ser. No. 16/585,846 filed on Sep. 27, 2019, the content of which is herein incorporated by reference in its entirety. In various embodiments, the circuit 2100 includes two or more emitter branches connected between the power supply and return paths. As depicted in FIG. 21, the circuit 2100 has a first group 2110 of solid-state lighting (SSL) emitters E1, E2, E3 that form a portion of a first emitter branch operably connected to the power supply path 2106 and the power return path 2108 in parallel with the first emitter branch. According to various implementations, the second group 2140 of emitters can be operably connected in series with one or more ballast resistors 2142. The second group 2140 of emitters can be configured to be operably connected to the power supply through the power supply path 2106 and the power return path 2108.

As shown in FIG. 21, the first emitter branch includes a current limiting circuit that, in various embodiments, includes a voltage regulator 2120 and a feedback resistor 2130. The voltage regulator 2120 has one or more input pins 2122, one or more output pins 2124, and an adjustment pins 2126. The input pin 2122 is operably connected to the power supply path 2106. The feedback resistor 2130 also operably connected between the voltage regulator's output and adjustment pins 2124, 2126. The feedback resistor 2130 also operably connects the current limiting circuit to the first group 2110 of the SSL emitters. Accordingly, the current limiting circuit is configured to operably connect a power supply to the first group 2110 of emitters, for example, via the first pad 2102 and the power supply path 2106.

According to various embodiments, the first group 2110 of emitters produces a first color of light and the second group 2140 produces a second color of light that is different from the first color. As an example, in various implementations the first color is a warm white color and the second color is a white color. Assigning a different color temperature to each group of emitters can in various embodiments provide the circuit 2100 with the ability to change light output in terms of both brightness and color temperature. According to various embodiments, the SSL circuits 2100 changes the overall light output and/or combined visual impression of the circuit's light output by changing which of the emitter groups is active and/or by changing the intensity or brightness of the light generated by one or both of the first and second emitter groups 2110 and 2140.

The embodiments of the present technology described herein are not intended to be exhaustive or to limit the technology to the precise forms disclosed in the following detailed description. Rather, the embodiments are chosen and described so that others skilled in the art can appreciate and understand the principles and practices of the present technology.

All publications and patents mentioned herein are hereby incorporated by reference. The publications and patents disclosed herein are provided solely for their disclosure. Nothing herein is to be construed as an admission that the inventors are not entitled to antedate any publication and/or patent, including any publication and/or patent cited herein.

It should be noted that, as used in this specification and the appended claims, the singular forms "a," "an," and "the" include plural referents unless the content clearly dictates otherwise. Thus, for example, reference to a composition containing "a compound" includes a mixture of two or more compounds. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration to. The phrase "configured" can be used interchangeably with other similar phrases such as arranged and configured, constructed and arranged, constructed, manufactured and arranged, and the like.

The invention claimed is:

1. An interconnectable circuit board array for lighting applications comprising:
   a plurality of circuit board assemblies, the circuit board assemblies comprising
      a first longitudinal edge, the first longitudinal edge comprising
         a first electrically conductive pad; and
         a second electrically conductive pad;
      a second longitudinal edge, the second longitudinal edge comprising
         a third electrically conductive pad; and
         a fourth electrically conductive pad;
   a plurality of board to board connectors, the board to board connectors comprising
      a first lateral side board to board connector, wherein the first lateral side board to board connector is configured to provide electrical communication between the first electrically conductive pad of a first circuit board assembly from amongst the plurality of circuit board assemblies and the third electrically conductive pad of a second circuit board assembly from amongst the plurality of circuit board assemblies; and a second lateral side board to board connector, wherein the second lateral side board to board connector is configured to provide electrical communication between the second electrically conductive pad of the first circuit board assembly and the fourth electrically conductive pad of the second circuit board assembly;

wherein the second longitudinal edge of the first circuit board assembly and the first longitudinal edge of the second circuit board assembly define a gap between the first circuit board assembly and the second circuit board assembly, the gap being bridged by the first lateral side board to board connector and the second lateral side board to board connector; and wherein the plurality of board to board connectors are configured so that the first circuit board assembly and the second circuit board assembly can be bent in a transverse plane with respect to one another to form an angle while allowing for electrical communication between the first circuit board assembly and the second circuit board assembly.

2. The interconnectable circuit board array of claim 1, further comprising one or more alignment tabs, wherein the one or more alignment tabs are disposed within the gap between the first and second circuit board assemblies, wherein removal of the one or more alignment tabs allows for the first circuit board assembly and the second circuit board assembly to be bent with respect to one another in a transverse plane to form an angle.

3. The interconnectable circuit board array of claim 1, wherein the plurality of board to board connectors are configured such that all of the first lateral side board to board connectors are contracted and all of the second lateral side board to board connectors are contracted when the first circuit board assembly and the second circuit board assembly are bent in a transverse plane with respect to one another to form an angle.

4. The interconnectable circuit board array of claim 1, wherein the sum of exterior angles between adjacent circuit board assemblies of the plurality of circuit board assemblies is 360 degrees when the plurality of circuit board assemblies are bent in a transverse plane.

5. The interconnectable circuit board array of claim 1, the circuit board assemblies comprising three interconnectable circuit board assemblies, wherein the three interconnectable circuit board assemblies assume a triangular shape in cross-section when bent in the transverse plane.

6. The interconnectable circuit board array of claim 1, wherein the plurality of circuit board assemblies form a first group and are configured to be joined with one or more additional groups of interconnectable circuit board assemblies to form a polygonal shape in cross-section when all interconnectable circuit board assemblies are bent in the transverse plane with respect to one another.

7. The interconnectable circuit board array of claim 1, further comprising one or more clips, wherein the one or more clips are configured to hold the plurality of circuit board assemblies in a bent position in the transverse plane.

8. The interconnectable circuit board array of claim 1, further comprising a plurality of light emitting diodes, wherein the plurality of light emitting diodes is disposed on the plurality of circuit board assemblies.

9. The interconnectable circuit board array of claim 1, wherein the plurality of board to board connectors provide both electrical communication and structural support.

10. The interconnectable circuit board array of claim 1, wherein the interconnectable circuit board array is configured to fit on a rod, a hollow tube, or a threaded rod.

11. An interconnectable circuit board array for lighting applications comprising:
a plurality of circuit board assemblies, the circuit board assemblies comprising
a first longitudinal edge; and
a second longitudinal edge;
a plurality of bendable lateral board to board connectors, wherein the plurality of bendable lateral board to board connectors are configured to provide electrical communication between a first circuit board from amongst the plurality of circuit board assemblies and a second circuit board from amongst the plurality of circuit board assemblies;

wherein the second longitudinal edge of the first circuit board and the first longitudinal edge of the second circuit board define a gap between the first circuit board and the second circuit board, the gap being bridged by at least one of the plurality of bendable lateral board to board connectors; and wherein the plurality of bendable lateral board to board connectors are configured so that the first circuit board and the second circuit board can be bent in a transverse plane with respect to one another to form an angle while allowing for electrical communication between the first circuit board and the second circuit board.

12. The interconnectable circuit board array of claim 11, further comprising one or more alignment tabs, wherein the one or more alignment tabs are disposed within the gap between the first and second circuit boards, wherein removal of the one or more alignment tabs allows for the first circuit board and the second circuit board to be bent with respect to one another in a transverse plane to form an angle.

13. The interconnectable circuit board array of claim 11, wherein the plurality of bendable lateral board to board connectors are configured such that all of the first longitudinal edge conductors are contracted and all of the second longitudinal edge conductors are contracted when the first circuit board and the second circuit board are bent in a transverse plane with respect to one another to form an angle.

14. The interconnectable circuit board array of claim 11, wherein the sum of exterior angles between adjacent circuit boards of the plurality of circuit board assemblies is 360 degrees when the plurality of circuit board assemblies are bent in a transverse plane.

15. The interconnectable circuit board array of claim 11, wherein the plurality of circuit board assemblies form a first group and are configured to be joined with one or more additional groups of interconnectable circuit boards to form a polygonal shape in cross-section when all interconnectable circuit boards are bent in the transverse plane with respect to one another.

16. The interconnectable circuit board array of claim 11, further comprising one or more clips, wherein the one or more clips are configured to hold the plurality of circuit board assemblies in a bent position in the transverse plane.

17. The interconnectable circuit board array of claim 11, further comprising a plurality of light emitting diodes, wherein the plurality of light emitting diodes is disposed on the plurality of circuit board assemblies.

18. The interconnectable circuit board array of claim 11, the circuit board assemblies comprising a lighting circuit, wherein the lighting circuit is configured to be cut at discrete points while maintaining lighting functionality.

19. A radial light source comprising:
an interconnectable circuit board array for lighting applications, comprising:
a plurality of circuit board assemblies, the circuit board assemblies comprising:
a first longitudinal edge, the first longitudinal edge comprising:
a first electrically conductive pad; and
a second electrically conductive pad;
a second longitudinal edge, the second longitudinal edge comprising:
a third electrically conductive pad; and
a fourth electrically conductive pad;
a plurality of board to board connectors, the board to board connectors comprising:
a first lateral side board to board connector, wherein the first lateral side board to board connector is configured to provide electrical communication between the first electrically conductive pad of a first circuit board assembly from amongst the plurality of circuit board assemblies and the third electrically conductive pad of a second circuit board assembly from amongst the plurality of circuit board assemblies; and
a second lateral side board to board connector, wherein the second lateral side board to board connector is configured to provide electrical communication between the second electrically conductive pad of the first circuit board assembly and the fourth electrically conductive pad of the second circuit board assembly;
wherein the second longitudinal edge of the first circuit board assembly and the first longitudinal edge of the second circuit board assembly define a gap between the first circuit board assembly and the second circuit board assembly, the gap being bridged by the first lateral side board to board connector and the second lateral side board to board connector; and
wherein the plurality of board to board connectors are configured so that the first circuit board assembly and the second circuit board assembly can be bent in a transverse plane with respect to one another to form an angle while allowing for electrical communication between the first circuit board assembly and the second circuit board assembly;
a pair of electrical wires configured to provide power to the interconnectable circuit board array; and
a mounting plate.

20. The radial light source comprising of claim 19, further comprising at least one of a rod, a hollow tube, or a threaded rod passing through at least a portion of the interconnectable circuit board array.

* * * * *